US011067607B2

(12) United States Patent
Lee et al.

(10) Patent No.: US 11,067,607 B2
(45) Date of Patent: Jul. 20, 2021

(54) SENSING SYSTEMS USING CURRENT STEERING BRIDGES

(71) Applicant: KSR IP Holdings, LLC, Wilmington, DE (US)

(72) Inventors: Joong K. Lee, Chatham (CA); Ryan W. Elliott, Thamesville (CA)

(73) Assignee: KSR IP Holdings, LLC, Wilmington, DE (US)

(*) Notice: Subject to any disclaimer, the term of this patent is extended or adjusted under 35 U.S.C. 154(b) by 0 days.

(21) Appl. No.: 16/670,613

(22) Filed: Oct. 31, 2019

(65) Prior Publication Data
US 2020/0062204 A1 Feb. 27, 2020

Related U.S. Application Data

(63) Continuation-in-part of application No. 15/679,628, filed on Aug. 17, 2017, now Pat. No. 10,466,090.

(60) Provisional application No. 62/376,186, filed on Aug. 17, 2016.

(51) Int. Cl.
*G01F 23/26* (2006.01)
*G01R 17/10* (2006.01)
(52) U.S. Cl.
CPC .......... *G01R 17/10* (2013.01); *G01F 23/266* (2013.01)
(58) Field of Classification Search
CPC .............................. G01R 17/10; G01F 23/266
See application file for complete search history.

(56) References Cited

U.S. PATENT DOCUMENTS

| 3,115,603 | A | | 12/1963 | Fluegel |
| 3,534,606 | A | | 10/1970 | Stamler et al. |
| 3,845,377 | A | * | 10/1974 | Shimotori ............... G01B 7/30 |
| | | | | 318/662 |
| 3,901,079 | A | | 8/1975 | Vogel |
| 4,149,231 | A | | 4/1979 | Bukosky et al. |
| 4,232,300 | A | | 11/1980 | Wright et al. |
| 4,403,219 | A | * | 9/1983 | Jarvinen ................. G01D 5/24 |
| | | | | 340/870.37 |
| 4,418,569 | A | | 12/1983 | Kuhnel |
| 5,750,903 | A | | 5/1998 | Ryhanen |

(Continued)

OTHER PUBLICATIONS

International Search Report dated Nov. 27, 2017 (2 pages) by International Searching Authority.

*Primary Examiner* — Clayton E. LaBalle
*Assistant Examiner* — Michael A Harrison
(74) *Attorney, Agent, or Firm* — Dinsmore & Shohl LLP

(57) ABSTRACT

Embodiments described herein are directed to a system having a processor and a bridge circuit. The bridge circuit includes a pair of differential voltage sources, a first pair of sensing elements and a second pair of sensing elements. The first pair of sensing elements generate a pair of measurement signals. The pair of measurement signals are independent of one another and based on the respective sensing element. The second pair of sensing elements communicatively coupled to first pair of sensing elements. The second pair of sensing elements define a first divider. The pair of measurement signals are input into the respective second sensing element of the second pair of sensing elements. The first divider is configured to output a first output signal to the processor. The first output signal is a first differential signal of the first pair of sensing elements.

20 Claims, 24 Drawing Sheets

(56) References Cited

U.S. PATENT DOCUMENTS

| | | | |
|---|---|---|---|
| 10,551,336 B2* | 2/2020 | Chang | G01N 27/12 |
| 2011/0113878 A1* | 5/2011 | Ohshima | G01F 23/266 |
| | | | 73/304 C |
| 2016/0047683 A1 | 2/2016 | Winkens et al. | |
| 2020/0228060 A1* | 7/2020 | Kampe | H03B 5/1215 |

* cited by examiner

SENSING SYSTEMS USING CURRENT STEERING BRIDGES

CROSS-REFERENCE TO RELATED APPLICATIONS

The present utility patent application is a continuation-in-part of U.S. patent application Ser. No. 15/679,628, filed on Aug. 17, 2017, which claims the benefit of U.S. Provisional Application Ser. No. 62/376,186, filed on Aug. 17, 2016, the contents of which are incorporated herein in its entirety.

FIELD OF THE INVENTION

The present invention relates to electronic circuits and systems. More specifically, the present invention relates to sensing circuits for detecting fluid, pressure, and/or force in automotive applications.

BACKGROUND OF THE INVENTION

Among many types of the sensors for automotive applications, a level sensor is one of the simplest sensors for the shape and size. For example, other sensors require the float mechanism or series of switches that switch upon the level increases or decreases. The level sensor has no requirement of the float mechanism or the series of small switches, but simple implementation of printed pattern of electrodes on a usual PCB so that the design and implementation is simple and compact. Capacitive based sensors are based upon the change in the capacitance within a given system, inductive based sensors are based upon the change in the inductance within the given system, and resistive sensors are based upon the change in the impedance within the given system. As levels change within the system, the amount of the capacitance, inductance, and/or impedance increases or decreases.

However, traditional capacitive, inductive and/or resistive based level sensors have several issues despite the simpler design and the applications. For example, traditional capacitive, inductive and/or resistive sensors have a high noise floor, more than any other type of implementation, because the source impedance of the capacitive, inductive and/or resistive sensor is very high so that the EMC design is very difficult. As such, the incoming noise cannot be easily drained due to the high source impedance. A high source impedance results in the output of the sensor has a high level of noise and becomes unstable. For example, the impedance of a single capacitor, inductor and/or resistor powered by a DC power source has essentially infinity as its impedance. As such, the frequency is traditionally driven at frequencies in the range of 10 Khz.

Accordingly, it is desirable to have a sensor that has the versatility of using a sensor driven by a high RF frequency and provide an accurate fluid, pressure, and/or force level measurement.

SUMMARY

In one embodiment, a system having a processor and a bridge circuit is provided. The bridge circuit includes a pair of differential voltage sources, a first pair of sensing elements and a second pair of sensing elements. The pair of differential voltage sources is configured to drive the bridge circuit. The first pair of sensing elements generate a pair of measurement signals. The pair of measurement signals are independent of one another and based on the respective sensing element. The second pair of sensing elements communicatively coupled to first pair of sensing elements. The second pair of sensing elements define a first divider. The pair of measurement signals are input into the respective second sensing element of the second pair of sensing elements. The first divider is configured to output a first output signal to the processor. The first output signal is a differential signal of the first pair of sensing elements.

In another embodiment, a system having a processor and a bridge circuit is provided. The bridge circuit includes a pair of differential voltage sources, a first pair of sensing elements and a second pair of sensing elements. The pair of differential voltage sources is configured to drive the bridge circuit. The second pair of sensing elements is communicatively coupled to the first pair of sensing elements and generate a pair of measurement signals. The pair of measurement signals are independent of one another and based on the respective second sensing element. The second pair of sensing elements define a first divider. The first divider is configured to output a first output signal to the processor. The first output signal is a differential signal of the first pair of sensing elements.

In yet another embodiment, a system having a bridge circuit is provided. The bridge circuit includes a pair of differential voltage sources, a first pair of sensing elements, a second pair of sensing elements, and a third pair of sensing elements. The pair of differential voltage sources are configured to drive the bridge circuit. The second pair of sensing elements is communicatively coupled to the first pair of sensing elements and generate a first pair of measurement signals. The first pair of measurement signals are independent of one another and based on the respective second sensing element. The second pair of sensing elements define a first divider. The first divider is configured to output a first output signal. The third pair of sensing elements is communicatively coupled to the first pair of sensing elements and in parallel with the second pair of sensing elements. The third pair of sensing elements generate a second pair of measurement signals. The second pair of measurement signals are independent of one another and based on the respective third sensing element. The third pair of sensing elements define a second divider. The second divider is configured to output a second output signal. The first output signal and the second output signal are connected to a divider. The divider provides a ratio-metric output. The ratio-metric output is independent from a common mode noise.

BRIEF DESCRIPTION OF THE DRAWINGS

Reference will now be made to the attached drawings, when read in combination with the following detailed description, wherein like reference numerals refer to like parts throughout the several views, and in which.

DETAILED DESCRIPTION OF THE PREFERRED EMBODIMENTS

Figure 1A:
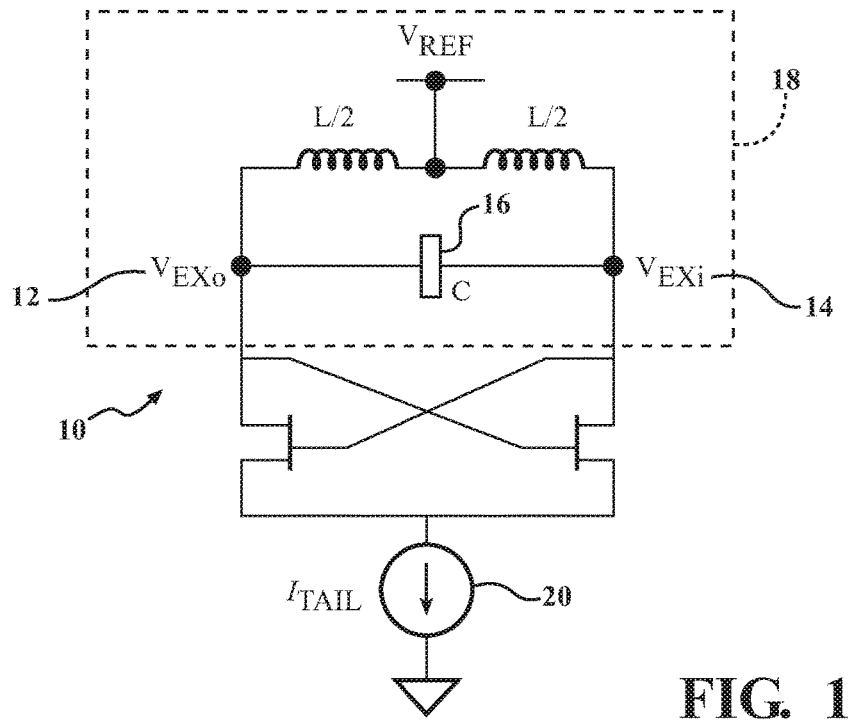
FIG. 1A schematically depicts a circuit diagram of a pair of opposite phase voltage sources realized by differential LC oscillator, according to one or more embodiments shown and described herein.

Embodiments described herein are directed to a system having a processor and a bridge circuit. The bridge circuit includes a pair of differential voltage sources, a first pair of sensing elements and a second pair of sensing elements. The pair of differential voltage sources is configured to drive the first bridge circuit.

The first and second pair of sensing elements may each be configured to generate the pair of measurement signals. The pair of measurement signals are independent of one another and based on the respective sensing element. The second pair of sensing elements communicatively coupled to the first pair of sensing elements. The second pair of sensing elements define a first divider. The first divider is configured to output a first output signal to the processor. The first output signal is a differential signal.

As will be further described, the first and second pair of sensing elements are a combination from the group of capacitors, inductors and resistors. In embodiments, where the first pair of sensing elements generate the pair of measurement signals, the pair of measurement signals are input into the respective second sensing element of the second pair of sensing elements. The pair of measurement signals is a differential measurement that corresponds to a force in contact with the bridge circuit. The differential measurement may be an impedance, inductance, or capacitance, or a combination thereof.

In embodiments, where the second pair of sensing elements generate the pair of measurement signals, the pair of measurement signals are independent of one another and based on the respective second sensing element. In this embodiment, the pair of measurement signals is a differential measurement that corresponds to a force in contact with the bridge circuit. The differential measurement may be an impedance, inductance, or capacitance, or a combination thereof.

In some embodiments, the bridge circuit is a single bridge for a differential output. In other embodiments, the bridge circuit is a dual bridge for a ratio-metric output. As such, in the dual bridge embodiment, the bridge circuit may include a third pair of sensing elements communicatively coupled to the first pair of sensing elements and in parallel with the second pair of sensing elements. The third pair of sensing elements are a combination from the group of capacitors, inductors and resistors. The third pair of sensing elements may receive or generate a second pair of measurement signals, received by or generated by the respective third sensing elements of the third pair of sensing elements that corresponds to a force in contact with the bridge circuit. The third pair of sensing elements define a second divider. The third pair of sensing elements output a second output signal to a divider. The divider divides the first output signal by the second output signal to generate a ratio-metric signal.

It should be appreciated that the differential signals and/or ratio-metric signal are independent from a common mode noise from a transducer and circuit by utilizing the bridge circuit. As such, independent differential signals may be used or a ratio metric of the differential output may be used simultaneously.

That is, as will be further described, the bridge circuit is configured for a differential measurement for the transmittal of maximum information while non-differential measurements includes specific signals and common signals that is not information. Further, the ratio-metric measurement for different media is measured with same sensor configuration because all of the common mode signals are factored out. The bridge circuit with ratio-metric measurements allows for not only implementing a capacitive sensor, but also allows for an inductive sensor and a resistive sensing within the sensing architecture.

Given the above, and referring to the attached illustrations, FIG. 1A generally shows at 10 a circuit depiction of a pair of opposite phase voltage sources supplied to the LC circuit and ultimately a processor chip, such being referenced subsequently by general example at 74 and including in one variant an inductive sensor chip and which are known to provide superior robustness and life cycle in comparison to magnetic sensors when applied to numerous vehicle applications including linear/rotary pedal position, fuel levels, and the like. Although not shown, existing current inductive sensors can further include a miniaturized processor chip or PC board, upon which are situated signal processing components, with the inductive signal input function including such as an aluminum rotor supported over an arrangement of transmitting and receiving coils.

A pair of variable capacitors associated with the chip can further include spatially arrayed plates which are submerged within the fluid (e.g. oil) medium in order to provide a fluid level readout according to the teachings of the present invention. The circuit 10 in FIG. 1A further depicts a pair of excitation voltage sources of opposite phase, at 12 and 14, which are positioned on opposite sides of capacitor 16 associated with an LC resonator of an inductive sensor driving circuit, see at 18, the output of which is supplied through a galvanometer 20 as a trace current (typically under 1 mA) for subsequent conversion to a changing voltage output.

Figure 1B:
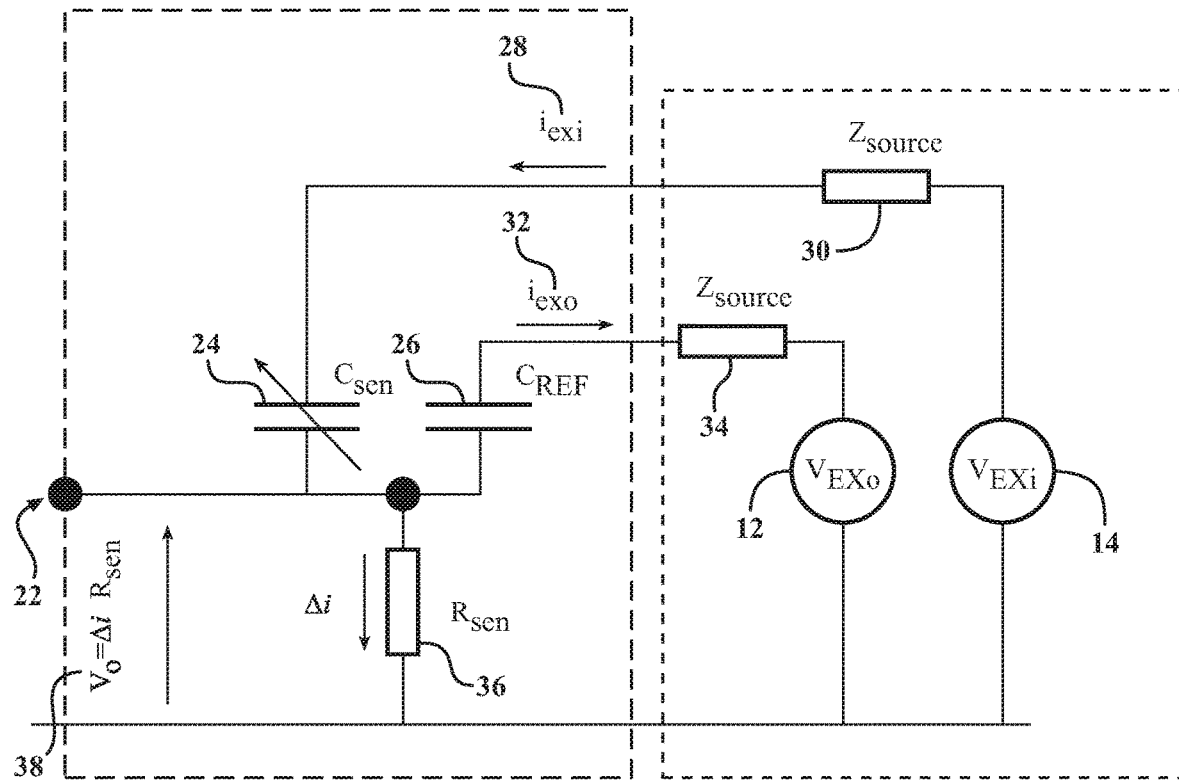
FIG. 1B schematically depicts a current steering bridge circuit with bias voltage in which the sensor capacitors are connected to the opposite phase voltage sources, according to one or more embodiments shown and described herein.

FIG. 1B is a depiction, see generally at 22, of a current steering bridge circuit with bias voltage in which a pair of sensor capacitors, see variable capacitor Csen at 24 and capacitor CREF 26, are connected to the opposite phase voltage sources 12 and 14, the magnitude of these being the same for all driving frequencies, such as including a non-limiting range of from several hundred Khz to a few tens of Mhz. In this arrangement, the variable capacitor 24 becomes a current source pumping a certain amount of excitation current, see at 28, through resistor 30, with the other capacitor 26 generating excitation current 32 through resistor 34.

Figure 1C:
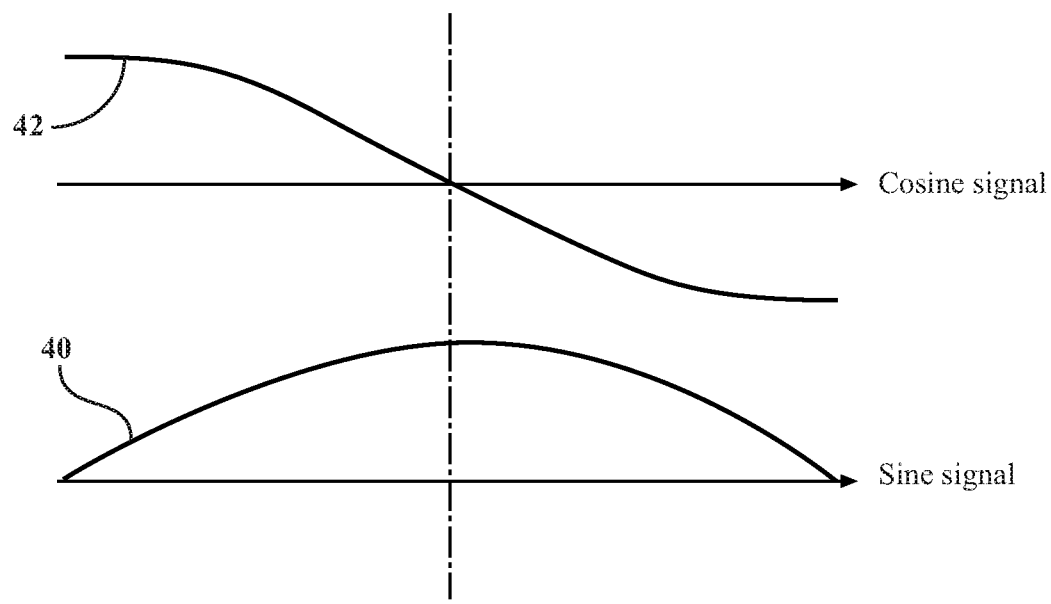
FIG. 1C schematically depicts a pair of sine and cosine signal depictions derived from a pair of current steering bridge circuits for use with a signal processor also applicable to inductive sensor applications, according to one or more embodiments shown and described herein.

The current steering bridge circuit structure operates to steer the currents generated in opposite phases with differential amount between the capacitors, the resultant sensing current, see at 36 and which corresponds to a differential current, appears as a voltage 38 through the resistor 36. FIG. 1C provides a pair of sine 40 and cosine 42 signal depictions derived from a pair of current steering bridge circuits such as depicted in FIG. 1B for use with a signal processor chip also applicable to inductive sensor applications.

Figure 2:
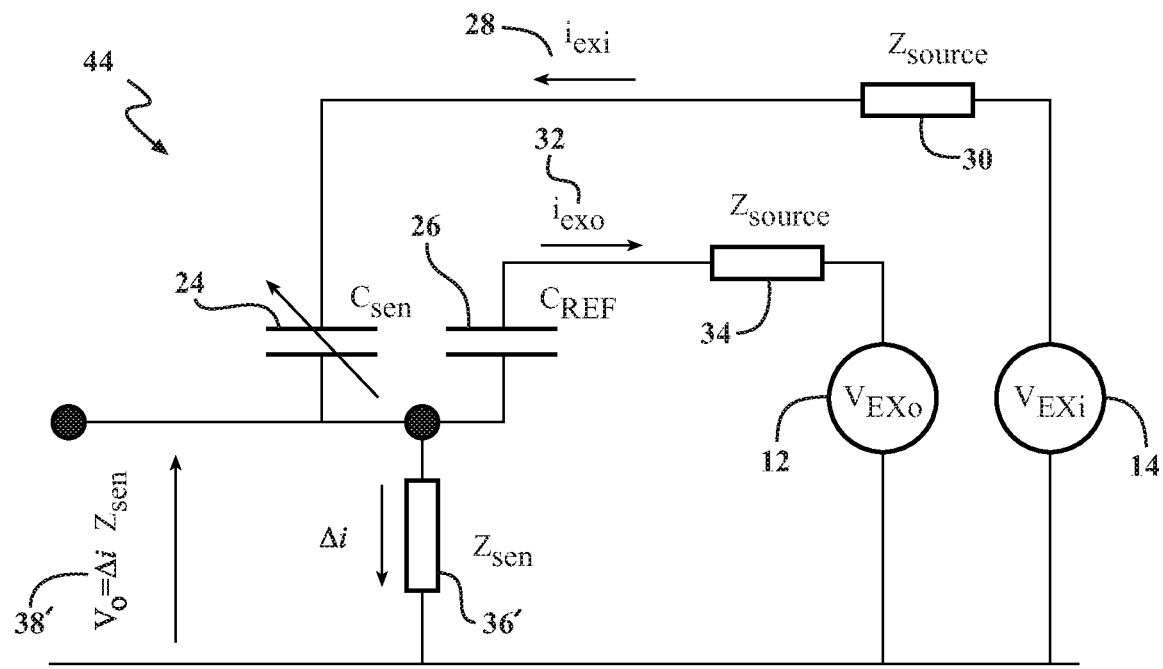
FIG. 2 schematically depicts a capacitance current steering bridge circuit with source voltage equal to zero and which instructs that the output voltage is proportional to the differential capacitance around zero, according to one or more embodiments shown and described herein.

FIG. 2 illustrates the capacitance current steering bridge circuit of FIG. 1B. As further generally depicted at 44 a source voltage set equal to zero instructs that the output voltage, see at depicted at 38', as being proportional to a differential capacitance 36' at approximately a zero reading.

Figure 3:
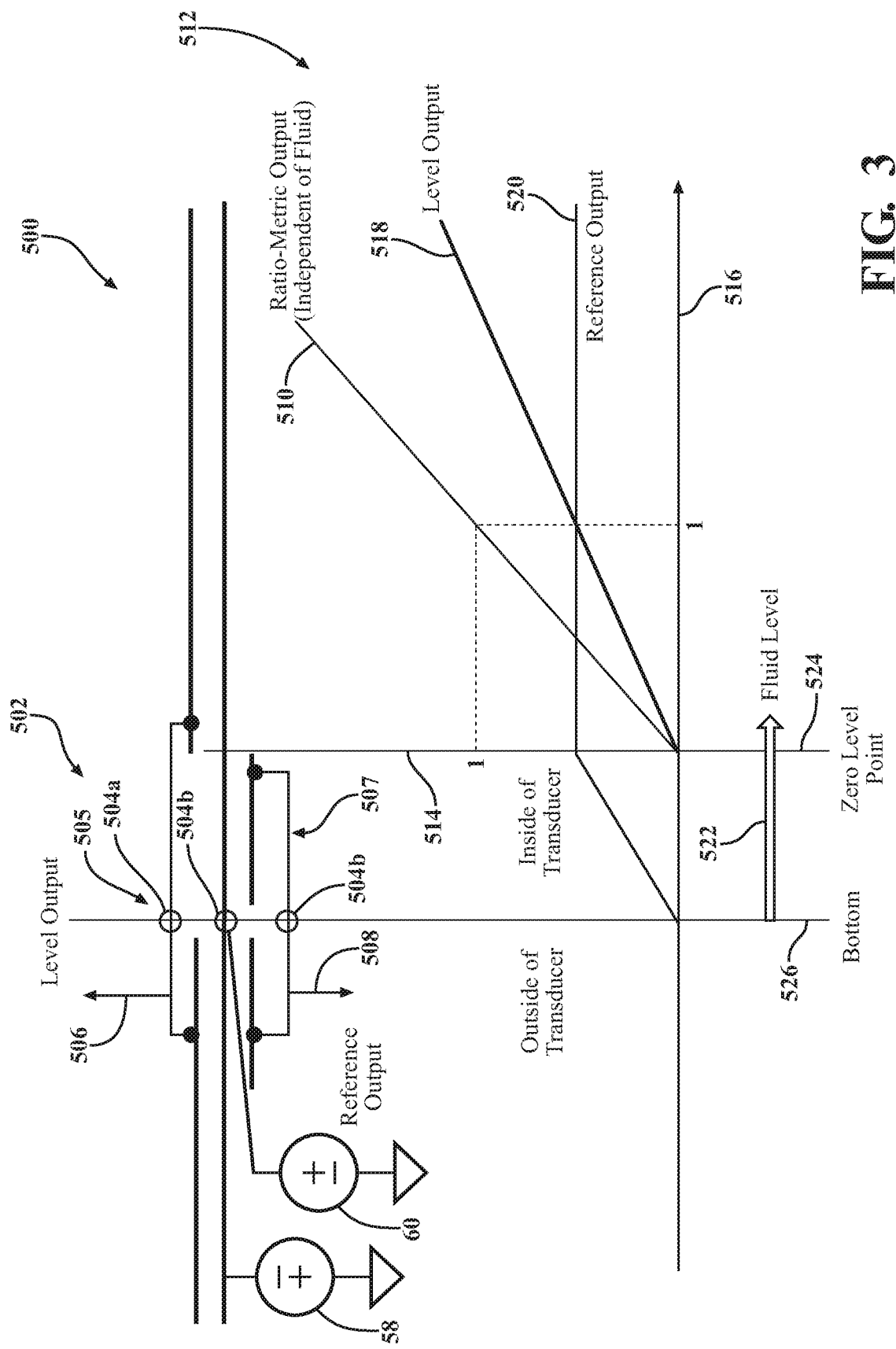
FIG. 3 schematically depicts a linear ratio-metric output of a three terminal transducer according to one or more embodiments shown and described herein.

FIG. 3 schematically depicts a system 500 that includes a transducer 502 having three terminals 504a, 504b, 504c communicatively coupled to the opposite phase voltage sources 58, 60. The opposite phase voltage sources 58, 60 are configured to drive a first variable capacitor 505 and a second variable capacitor 507 to produce a level output 406 and a reference output 508. It should be appreciated that this application is not limited to capacitors and may be inductors, resistors, and/or a combination thereof. As such, FIG. 3 illustrates a linear ratio-metric output 510 with a three terminal transducer. It should be appreciated that this arrangement permits for a compact transducer board. The linear ratio-metric output 510 is described with respect to a graph 512 having an ordinate 514 and an abscissa 516 in which the level output 506 and the reference output 508 may be graphically illustrated as the level output graph line 518 and the reference output graph line 520. The graph 512 further illustrates a fluid level 522, a bottom 526 and a zero level point 524. The bottom 526 may be a bottom of a reservoir or the like.

The zero level point 524 may be the minimum fluid level required to obtain a reading. As illustrated, the linear ratio-metric output 510 is independent of the fluid level 522. As such, by taking the ratio of the two differential outputs (e.g., the level output 506 and the reference output 508), that changes with the fluid level 522, the ratio-metric output 512 is fluid independent and the bridge circuit eliminates common mode noise from the transducer and the circuit, as discussed in greater detail herein. It should be appreciated that the fluid level 522 is for example purposes only and that the same could be illustrated with pressure, force, and the like, such that there is two differential outputs. For example, in the case of force, one level output is the force measured as applied and the reference output is the normal force without applied force.

Figure 4:
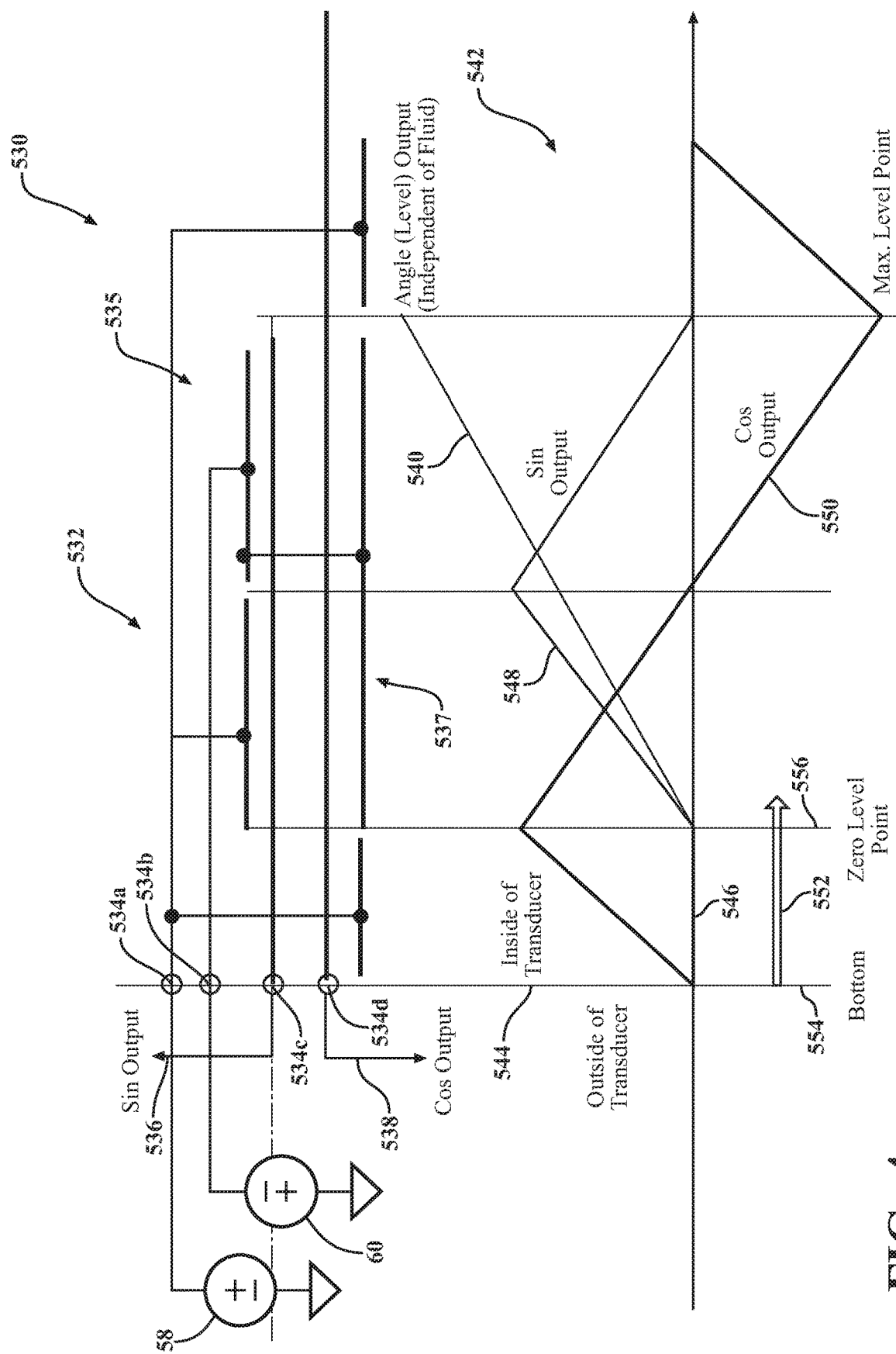
FIG. 4 schematically depicts a quadrature ratio-metric output of a four terminal transducer according to one or more embodiments shown and described herein.

FIG. 4 schematically depicts a system 530 that includes a transducer 532 having four terminals 534a, 534b, 534c, 534d communicatively coupled to the opposite phase voltage sources 58, 60. The opposite phase voltage sources 58, 60 are configured to drive a first variable capacitor 535 and a second variable capacitor 537 to produce a sine output 536 and a cosine output 538. It should be appreciated that this application is not limited to capacitors and may be inductors, resistors, and/or a combination thereof. As such, FIG. 4 illustrates a quadrature ratio-metric output 540 with a four terminal transducer. It should be appreciated that this arrangement permits for a compact transducer board and may require an arctangent processor. The quadrature ratio-metric output 540 is described with respect to a graph 542 having an ordinate 544 and an abscissa 546 in which the sine output 536 and the cosine output 538 may be graphically illustrated as the sine output graph line 548 and the cosine output graph line 550. The graph 542 further illustrates a fluid level 552, a bottom 554 and a zero level point 556. The bottom 554 may be a bottom of a reservoir or the like.

The zero level point 556 may be the minimum fluid level required to obtain a reading. As illustrated, the quadrature ratio-metric output 540 is an angle output independent of the fluid level 552. As such, by taking the angle ratio of the two differential outputs (e.g., the sine output 536 and the cosine output 538), that changes with the fluid level, the quadrature ratio-metric output 540 is fluid independent and the bridge circuit eliminates common mode noise from the transducer and the circuit, as discussed in greater detail herein. It should be appreciated that the fluid level 552 is for example purposes only and that the same could be illustrated with pressure, force, and the like, such that there is two differential outputs. For example, in the case of force, one level output is the force measured as applied and the reference output is the normal force without applied force.

Figure 5A:
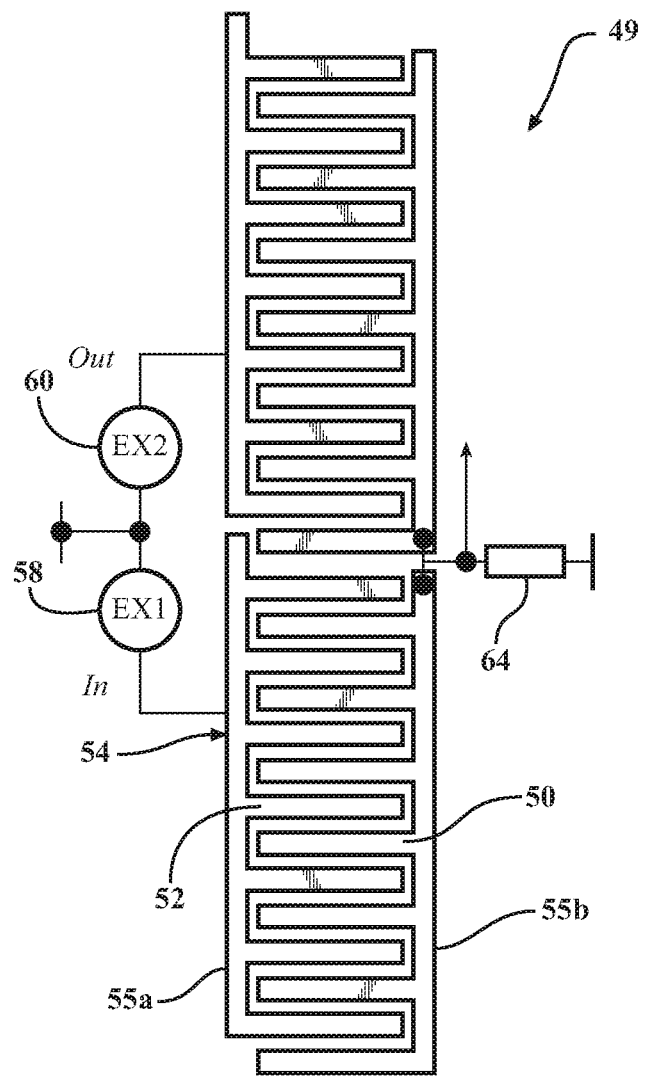
FIG. 5A schematically depicts variable capacitors of a capacitive voltage divider having an I phase on a first layer and Q phase on a second layer which are integrated into an associated processor chip for required quadrature signal generation, according to one or more embodiments shown and described herein.
Figure 5B:
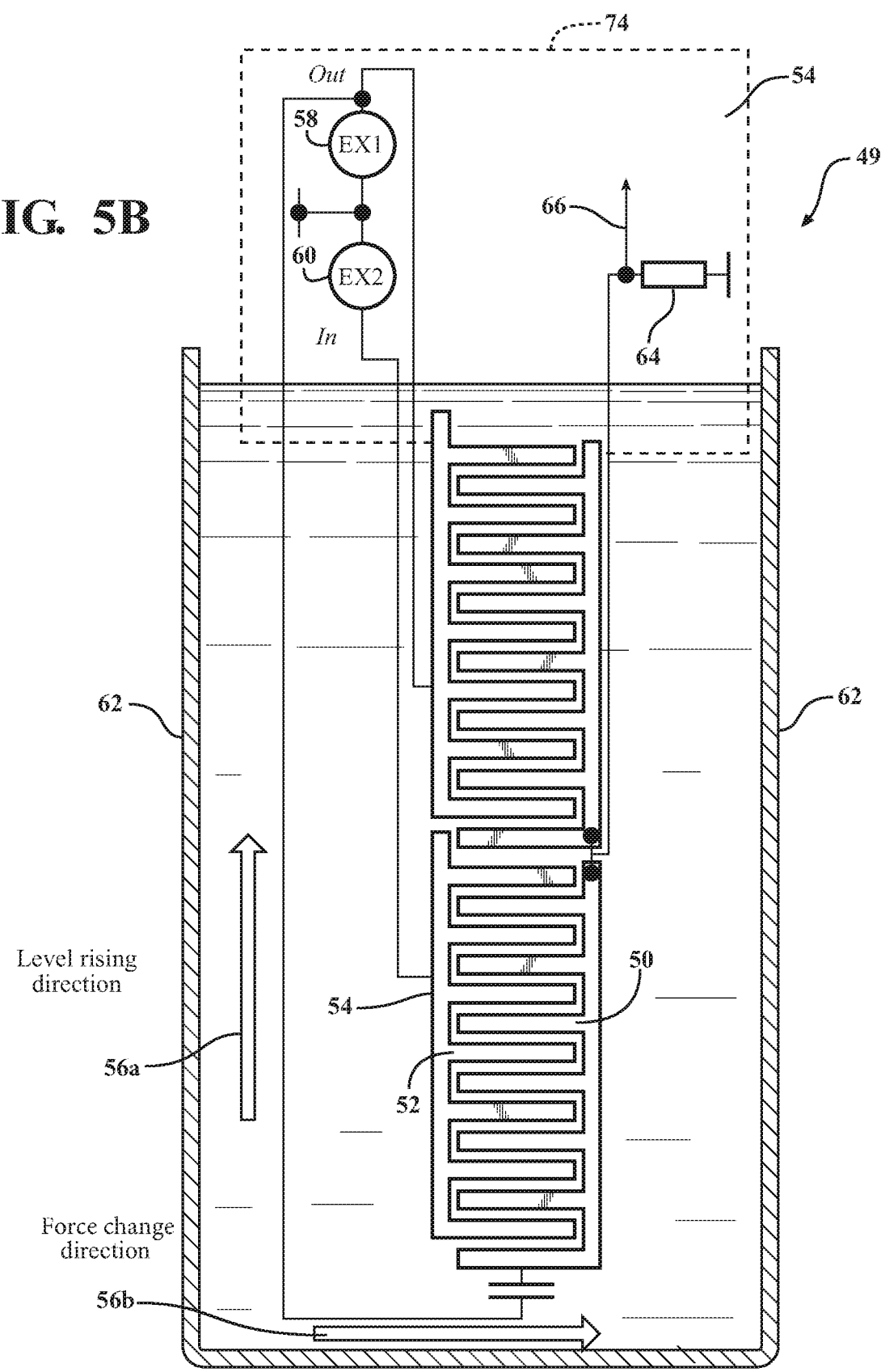
FIG. 5B schematically depicts the variable capacitors of the capacitive voltage divider of FIG. 5A positioned within a reservoir according to one or more embodiments shown and described herein.

FIGS. 5A and 5B respectively provide for a schematic illustration of a system 49 having capacitive plates. The plates are a first variable capacitor 50 and a second variable capacitor 52 implemented within a multi-layer printed circuit board (PCB) 54. The PCB 54 may have a first layer 55a and a second layer 55b in which the first layer may be an I phase and the second layer may be a Q phase. The system 49 further includes the opposite phase voltage sources 58, 60 configured to drive the first variable capacitor 50 and the second variable capacitor 52 corresponds to quadrature signal generation by the pair of out of phase voltage sources, with the signals detected representing the differential of the voltages.

The variable capacitors 50, 52 the PCB 54 and/or the opposite phase voltage sources 58, 60 may be integrated into a processor 74 configured for quadrature signal generation. It should be appreciated that the differential capacitance for each signal can be set around 5 pF (pico farads) or more. It should be appreciated that the differential capacitance for each signal can be set less than the 5 pF (pico farads). It is further understood that the layouts depicted represent only one possible example of the capacitance plate structure. In on embodiment, the capacitance plate structure may include simple strips provided for each electrode in order to minimize in-plane capacitance as compared to out-of-plane capacitance.

In embodiments, the variable capacitors 50, 52 may be configured to detect a level rising 56a within an area having a pair of sidewalls 62, a force change 56b between the sidewalls 62 caused from the movement of the sidewalls, a change in fluid, gas, and the like as a result of force, and/or some other method, and the like. For instance, the area may be a reservoir, a pair of plates, and the like, such that the area may be any area where a fluid, a pressure, a force, and the like may be measured. For example, a force applied to a pedal pad of a brake, an accelerator, or a clutch pedal is envisioned. That is, the movement of plates, a force change between the plates of a fluid, gas, solid, or other acting on the bridge circuit, and the like, may be used such that the bridge circuit senses this change and may compare it to a reference bridge circuit to determine the amount of force, such that the reference capacitor may be used to determine creep and other principles. It should be appreciated that the arrows 56a, 56b are merely illustrative and the direction of the force or the level rising may be in any direction between the pair of sidewalls 62. Further, it should be appreciated that at least one of the variable capacitors may be connected in series with another passive element 64 forming a divider having an output 66. The passive element may be a capacitor, resistor, inductor, and/or a combination thereof.

Figure 6:
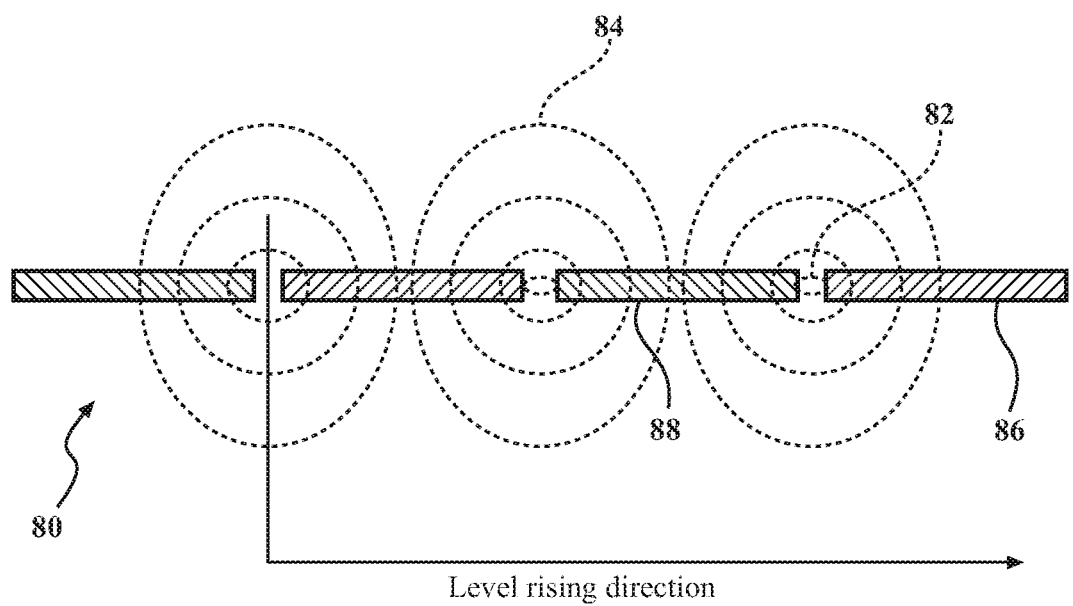
FIG. 6 is a sectional illustration of inter-digital electrode capacitance forming with electric field lines, such as to prevent an oil fluid within which the associated processor is submerged from sticking between the thickness of the capacitor plates, thereby improving sensing speed and associated response time, according to one or more embodiments shown and described herein.

FIG. 6 is a sectional illustration, generally at 80, of an inter-digital electrode capacitance forming with electric field lines (see both in-field 82 and out-of-field 84) arrayed between ground fingers 86 and alternating capacitor fingers 88, such assisting in preventing an oil fluid within which the associated processor is submerged from sticking between the thickness of the capacitor plates, thereby improving sensing speed and associated response time. Major viscous forces result in the gaps established and where the in-field lines 82 exist in relatively high density, it being further understood that when the narrow gaps are filled with an epoxy like coating, the region will not respond with the oil interaction, this further assisting in reduction of signaling error.

As further supported by the above illustrations, a feedback loop with LC circuit is applied to the received voltages 12,14 for maintaining a constant value in order to compensate for the aging/acidization changes in the dielectric constants associated with the target fluid (e.g. oil), it being further understood that the difficulty in fluid capacitance measurement is in large part due to such changes in the dielectric constant of the fluid resulting from its aging/acidization. The feedback loop on the received voltages maintains a constant value based on an established function, with the excitation voltages 12,14 being varied to maintain constant the input signal(s).

Additional changes in correcting feedback loop can include utilizing a sampling mechanism that exhibits greater resolution than required to allow the input signal to be reduced while still maintaining an output resolution as the excitation voltage reaches its limits. Such controls can provide, in one non-limiting example, for a greater than factor or four range (4x) in the dielectric constant with a given fluid type.

Balancing a RF capacitor sensor associated with a dielectric constant is important in fluid applications. A balance of capacitors will define a null signal point, thus allowing a measuring of the fluid level regardless of the dielectric constant of the fluid. This is important for obvious reasons, such as the change in the dielectric constant due to temperature, thickness, breakdown of the fluid, etc. Balancing a capacitor pair requires the same amount of in capacitance ($Q_{IN}$) as out capacitance ($Q_{OUT}$) with a balanced voltage pair.

Figure 7A:
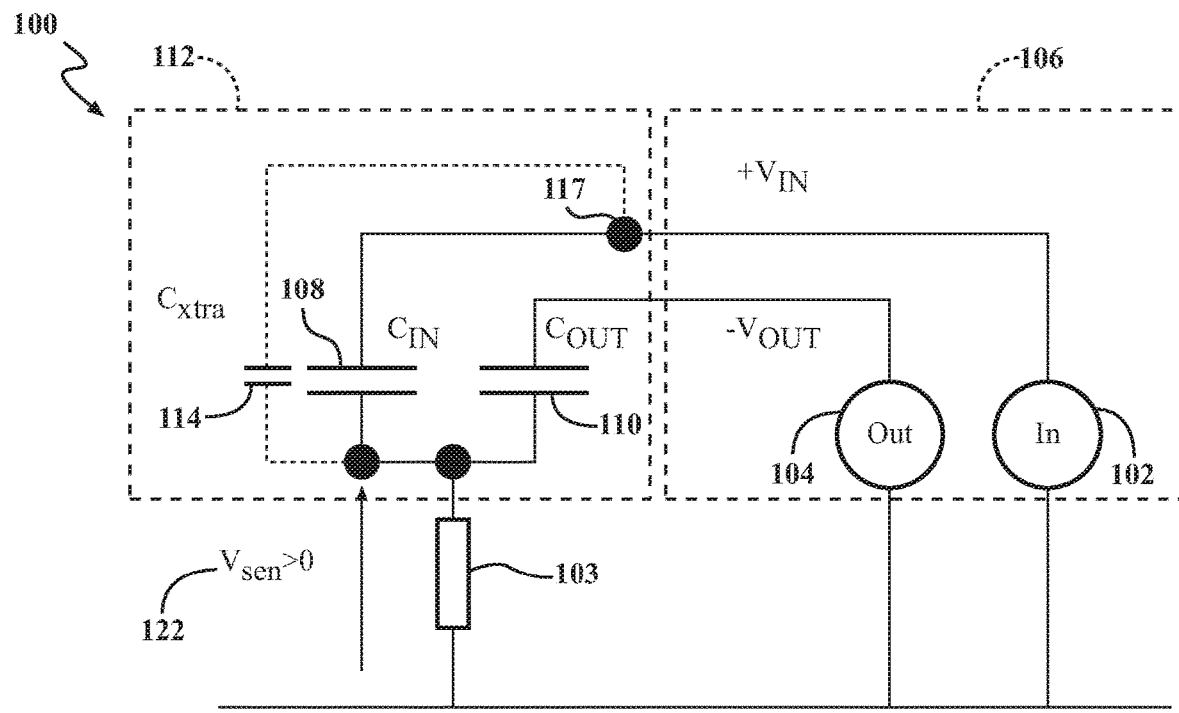
FIG. 7A is a circuit depiction of an unbalanced capacitor pair with a balanced voltage pair of opposite phase voltage sources, according to one or more embodiments shown and described herein.

An unbalanced circuit, as shown in the circuit 100 in FIG. 7A illustrates the voltage $V_{sen}$ 122 is greater than zero due to the geometry in control relay and capacitor plates. The circuit 100 in FIG. 7A further depicts a resister 103 and a pair of voltage sources of opposite phase, an in-phase voltage 102 and an out-phase voltage 104, the opposite phase voltage sources 102 and 104 thus create a balanced voltage pair 106 wherein $V_{IN}=-V_{OUT}$. Further depicted is a pair of capacitors, $C_{IN}$ 108 and $C_{OUT}$ 110 connected to the opposite phase voltage sources 102 and 104 and an additional control capacitor $C_{ctrl1}$ 114 in parallel with capacitor $C_{IN}$ 108 and driven by the same phase voltage source 102, bonded at 117, thus having an unbalanced capacitor pair 112 wherein $V_{sen}$ 122 is greater than zero.

Figure 7B:
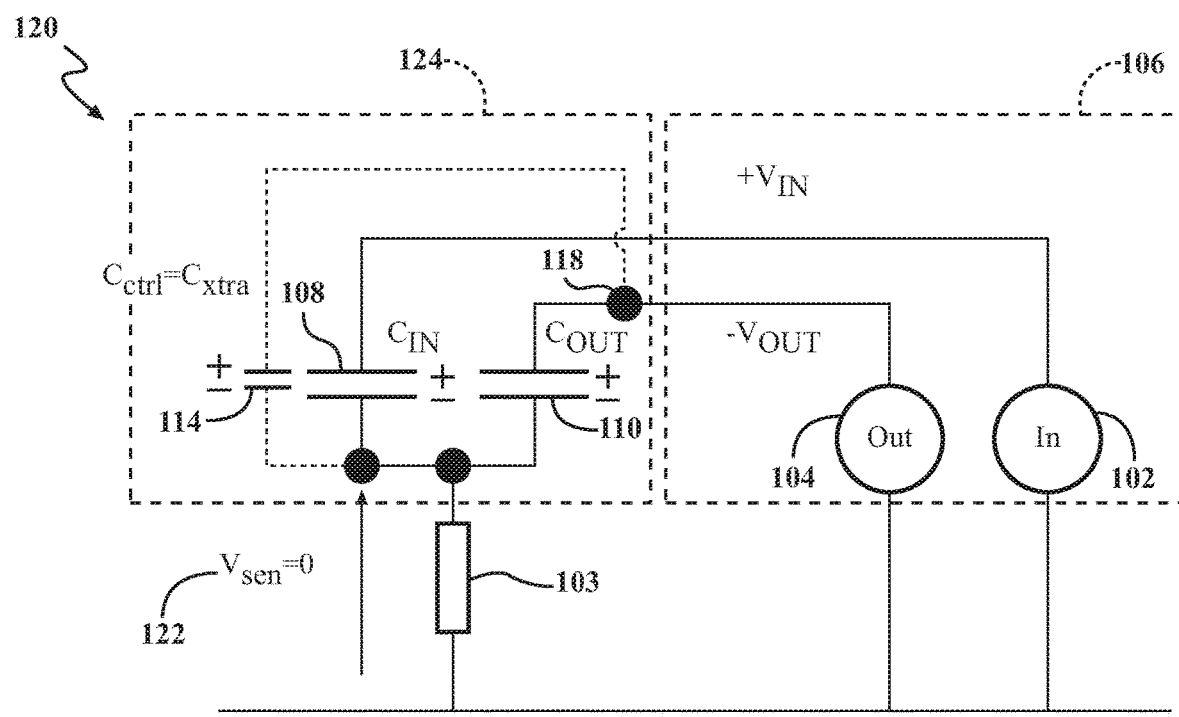
FIG. 7B is a circuit depiction of a balanced capacitor pair with the insertion of a single control capacitor and with a balanced voltage pair of opposite phase voltage sources, according to one or more embodiments shown and described herein.

FIG. 7B is a depiction, see generally at 120, of a balanced capacitor system 124 wherein $V_{sen}$ 122 is equal to zero. The circuit 120 in FIG. 7B further depicts a resister 103 and opposite phase voltage sources 102 and 104, the opposite phase voltage sources 102 and 104 thus create a balanced voltage pair 106. Further depicted is a balanced system 124 having a pair of capacitors, $C_{IN}$ 108 and $C_{OUT}$ 110 connected to the opposite phase voltage sources 102 and 104 and an additional control capacitor $C_{ctrl1}$ 114 in parallel with capacitor $C_{IN}$ 108 but driven by an opposite phase voltage source 104, at bonded point 118. This allows a balancing of an unbalanced capacitor pair by a voltage pair. In other words, the control capacitance driven by the opposite branch is equal to the unbalanced portion of the capacitor pair. This can be depicted by the following equations:

$$C_{IN}V_{IN}+C_{ctrl1}V_{OUT}=C_{OUT}V_{OUT} \quad \text{Equation 1:}$$

$$(C_{IN}-C_{ctrl1})V_{IN}=C_{OUT}V_{OUT} \quad \text{Equation 2:}$$

A control capacitor may be added to circuit 120 using the above equations to balance a capacitor wherein $C_{IN}$ is greater than $C_{OUT}$. The same principle applies, by adding the control capacitor and wiring the control capacitor to the opposite branch of the voltage pair, $V_{sen}$ is equal to 0.

Figure 7C:
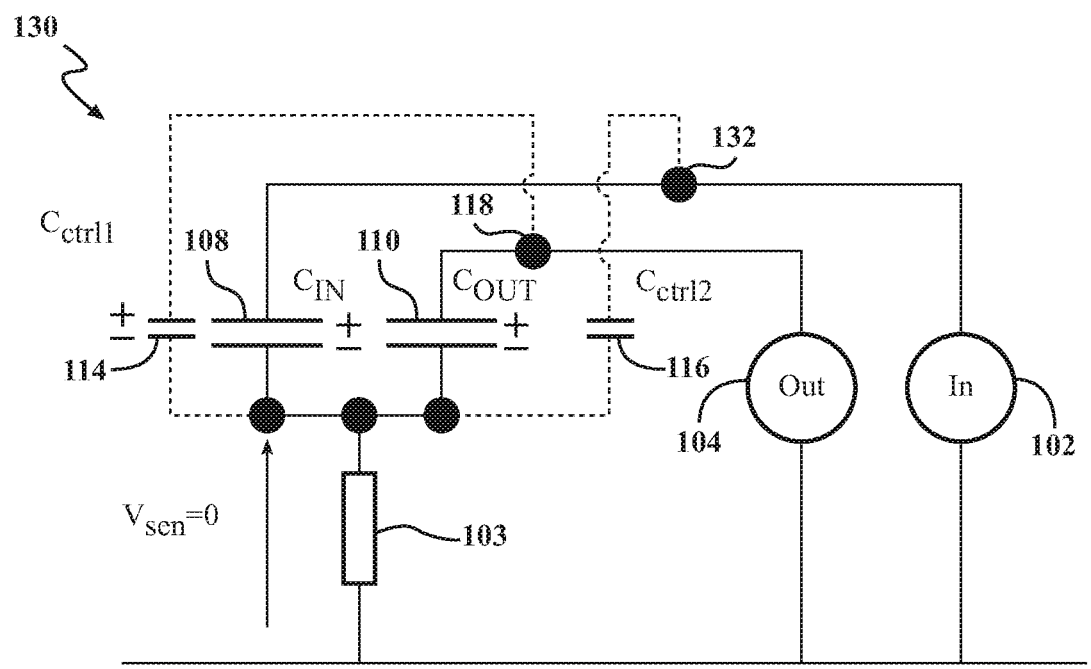
FIG. 7C is a circuit depiction of a balanced capacitor pair with the insertion of two control capacitors and with a balanced voltage pair of opposite phase voltage sources, according to one or more embodiments shown and described herein.

However, by adding a single control capacitor, a parasitic unbalance may occur. To neutralize any parasitic losses, or stray capacitance, a second control capacitor may be added with any voltage pair. FIG. 7C illustrates the circuit 130 having an additional control capacitor $C_{crtl2}$ 116 added in parallel with $C_{IN}$ 108 and similarly connected to the in-phase voltage 102, at bonding point 132. Balancing by inserting control capacitors can be depicted by the following equation:

$$C_{IN}V_{IN}+C_{ctrl1}V_{OUT}=C_{OUT}V_{OUT}+C_{ctrl2}V_{IN} \quad \text{Equation 3:}$$

In utilizing by definition that $V_{OUT}=-V_{IN}$, Equation 3 becomes:

$$(C_{IN}V_{IN}-C_{ctrl1})V_{IN}=(C_{OUT}V_{OUT}-C_{ctrl2})V_{OUT} \quad \text{Equation 4:}$$

It should be appreciated that $C_{crtl2}$ may be added to any unbalanced capacitance such as the parasitic of wiring and connectors.

Figure 8:
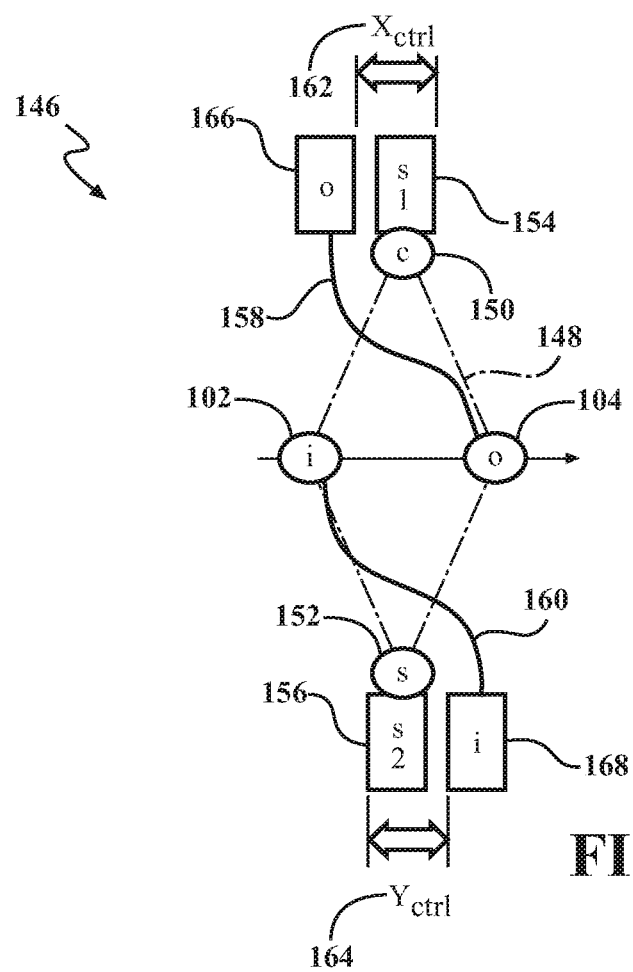
FIG. 8 illustrates the sensor layout having a rhombus design, according to one or more embodiments shown and described herein.

As depicted in FIG. 8, the rhombus layout 148 (illustrated by a long and short line pattern) of the wires of the driver and the driver are shown. Further, FIG. 8 depicts a quadrature signal balancing layout having a signal driver 150 that drives a cosine signal and signal driver 152 that drives a sine signal through the capacitor pair driven by the voltage pair 102, 104. It should be appreciated that other signal balancing and other drivers may be used. Further yet, in this final assembly of the sensor 146, tuning pads 154, 156 may be necessary in order to balance the final system. The balancing mechanism can be by the same balancing mechanism as discussed herein, namely, using sliding tuning capacitors 154, 156 wired to the opposite phase of the voltage pair 102, 104. Further, the overlapping or distance between the tuning pads forms the needed capacitance to balance the system as indicated by the distance $X_{crtl}$ 162 and $Y_{ctrl}$ 164 corresponding to the distance between the tuning pad 154, 156 and the voltage bonding 166, 168. In particular, in-phase voltage source 102 is operatively connected to voltage bond 168 through wire 160 and is $Y_{ctrl}$ distance from tuning pad 156. Likewise, out-phase power 104 is operatively connected to voltage bond 166 through wire 158 and is $X_{crtl}$ distance from tuning pad 154.

Figure 9:
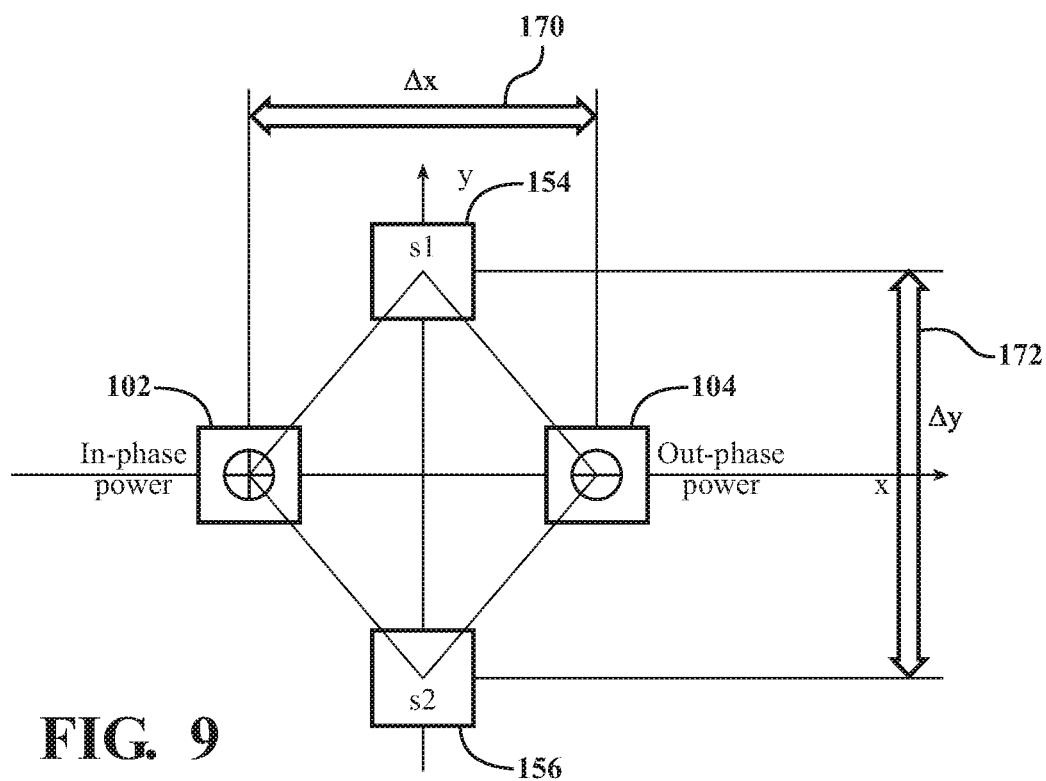
FIG. 9 illustrates the rhombus design parameters, according to one or more embodiments shown and described herein.

FIG. 9 depicts that under the rhombus balancing neutralizing of wires, the distance between the two power lines, or voltage sources 102, 104 should be closer than that of the signal lines 154, 156. It should be appreciated that coupling between a signal to any phased power line are the same as long as a rhombus can be drawn on the connecting wires as illustrated. When a rhombus can be formed, the neutralization of the wires is automatically met if the distance of $\Delta Y$ 172≥$\Delta X$ 170; however the $\Delta Y$ 172 distance between the signals 156, 154 should be as large as possible within a design limit. It should be appreciated that this rhombus design for any connector wire assembly functions to neutralize the wires regardless of IDF or quadrature sensor types. Further, the rhombus diagram may be incorporated to a sensor PCB and connecting wire assembly to cancel out the electrical influences.

Now referring back to FIG. 8, parasitic losses of a balanced system may create unintended capacitance. As a result, parasitic losses may be controlled by using tuning pads 154, 156 at each signal driver 150, 152 respectively, and a rhombus diagram 148 (indicated by a dotted and dashed line) for a connector wire assembly. Calibrating the system can be used anywhere a capacitive unbalance exits. Further, a sensor plate unbalance may also be tuned in this method. Further yet, a connector pin and circuit unbalance can be done in the same way.

Figure 10:
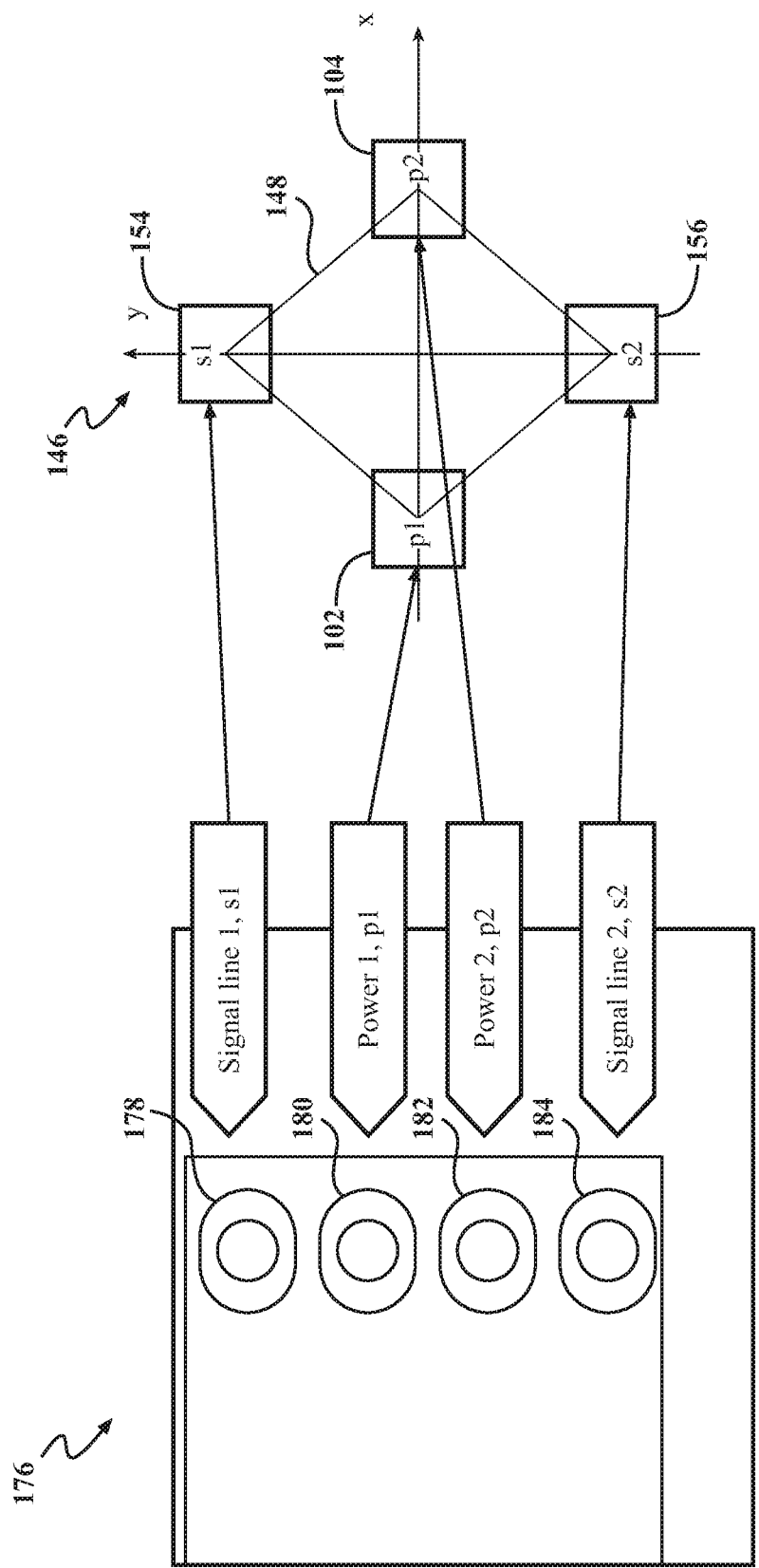
FIG. 10 illustrates the connector pins layout on the sensor, according to one or more embodiments shown and described herein.

FIG. 10 depicts the layout of the connector pins on a sensor. As illustrated, the rhombus pin diagram 148 of connecting the wires between the sensor 146 to the circuit 176 is met thus the signal decoupling is ensured. As shown, the distance between the two power lines 102, 104 are as close as possible 180, 182 while the distance between the two signal lines 154, 156 is as large as possible 178, 184. Further, the pin layout, while illustrated vertically, may be in any configuration where the signal lines are separated by at least two power lines.

Figure 11:
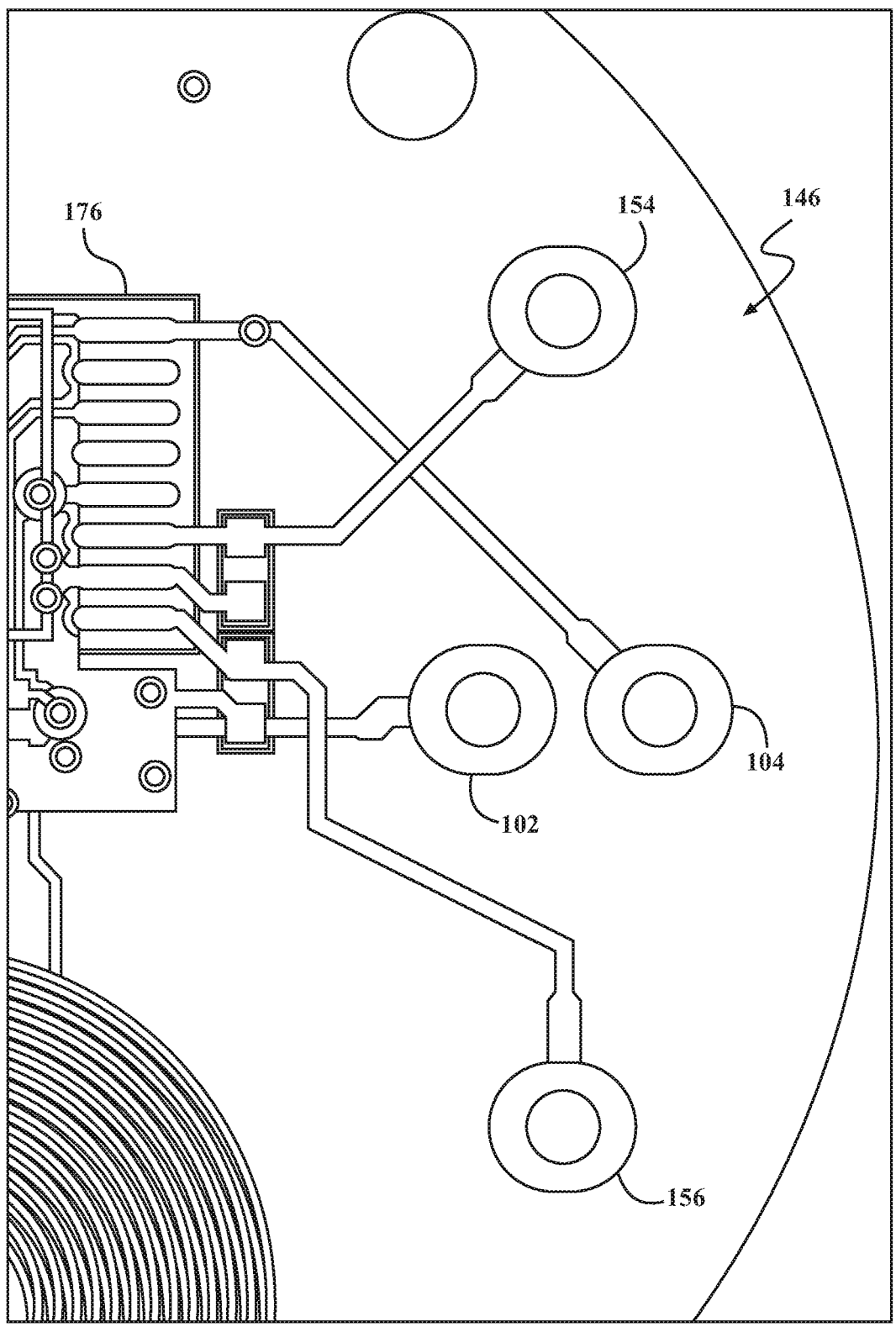
FIG. 11 illustrates the circuit layout on the PCB, according to one or more embodiments shown and described herein.

FIG. 11 depicts the tuning pad and driving pin layout of the sensor. The rhombus design 148 is apparent in the sensor layout 146. Again, as shown, the distance between the two power lines 102, 104 are as close as possible while the distance between the two signal lines 154, 156 is as large as possible. Further, the signal lines cross the power lines perpendicularly.

Figure 12:
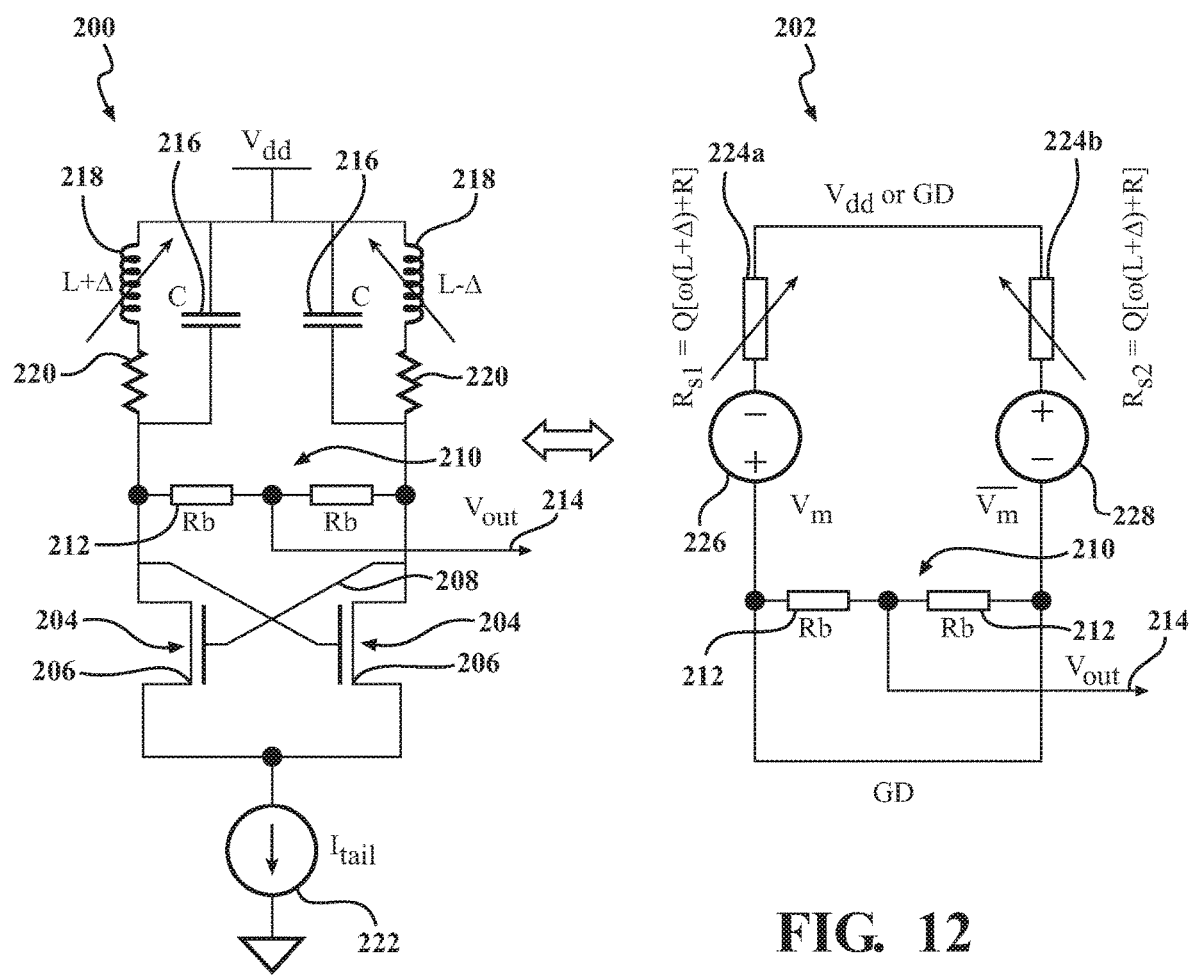
FIG. 12 schematically illustrates an LC inductive sensor having a differential LC oscillator and the Thevenin equivalent circuit, according to one or more embodiments shown and described herein.

FIG. 12 schematically illustrates an LC inductive sensor having a differential LC oscillator and the Thevenin equivalent circuit. The LC inductive sensor 200 includes a pair of N-channel transistors 204 having a bridging element 208 between the drains 206. The LC inductive sensor 200 further includes a voltage divider 210 having passive element pair 212 providing for a single differential output 214. As such, it should be appreciated that the LC inductive sensor 200 is a single AC bridge for the single differential output 214. Moreover, the LC inductive sensor 200 includes a pair of capacitors 216 where each capacitor is connected in parallel and connected to one of a pair of inductors 218 and resistors 220, where each inductor 218 and resistor 220 of the pair is in series with each other and the capacitor 216. The tail current 222 sinks with a pair of transistors 204 and with the corresponding drain load 206.

As shown, the Thevenin equivalent 202 is taken from the pair of inductors 218 so that the equivalent source impedance 224a is $R_{s1}=Q[\omega(L+\Delta)+R]$ and equivalent source impedance 224b is $R_{s2}=Q[\omega(L-\Delta)+R]$. Furthermore, the equivalent differential voltage source $V_m$ 226 and the inverse voltage source $V'_m$ 228 with the source impedance and the complementary output strength may be calculated from the single differential output 214. The Thevenin equivalent 202 transforms the source impedance 224a, 224b multiplied by a factor of Q. Therefore, the circuit acts as an impedance amplifier that multiples the sensing quantity of Δ in an inductance sensing circuit. The single differential output 214 for the inductance sensing is $$V_{out} = \frac{\Delta}{L} V_m.$$

It should be appreciated that any impedance element of the circuit 200 and equivalent 202 can be amplified by a factor of Q and the LC oscillator may be used as a sensor with a differential signal. It should be appreciated that the Factor Q and I phase have opposite direction currents. Further, it should be appreciated that any small changes on the resistor, capacitor, or inductor are amplified by two times the tail current.

Figure 13:
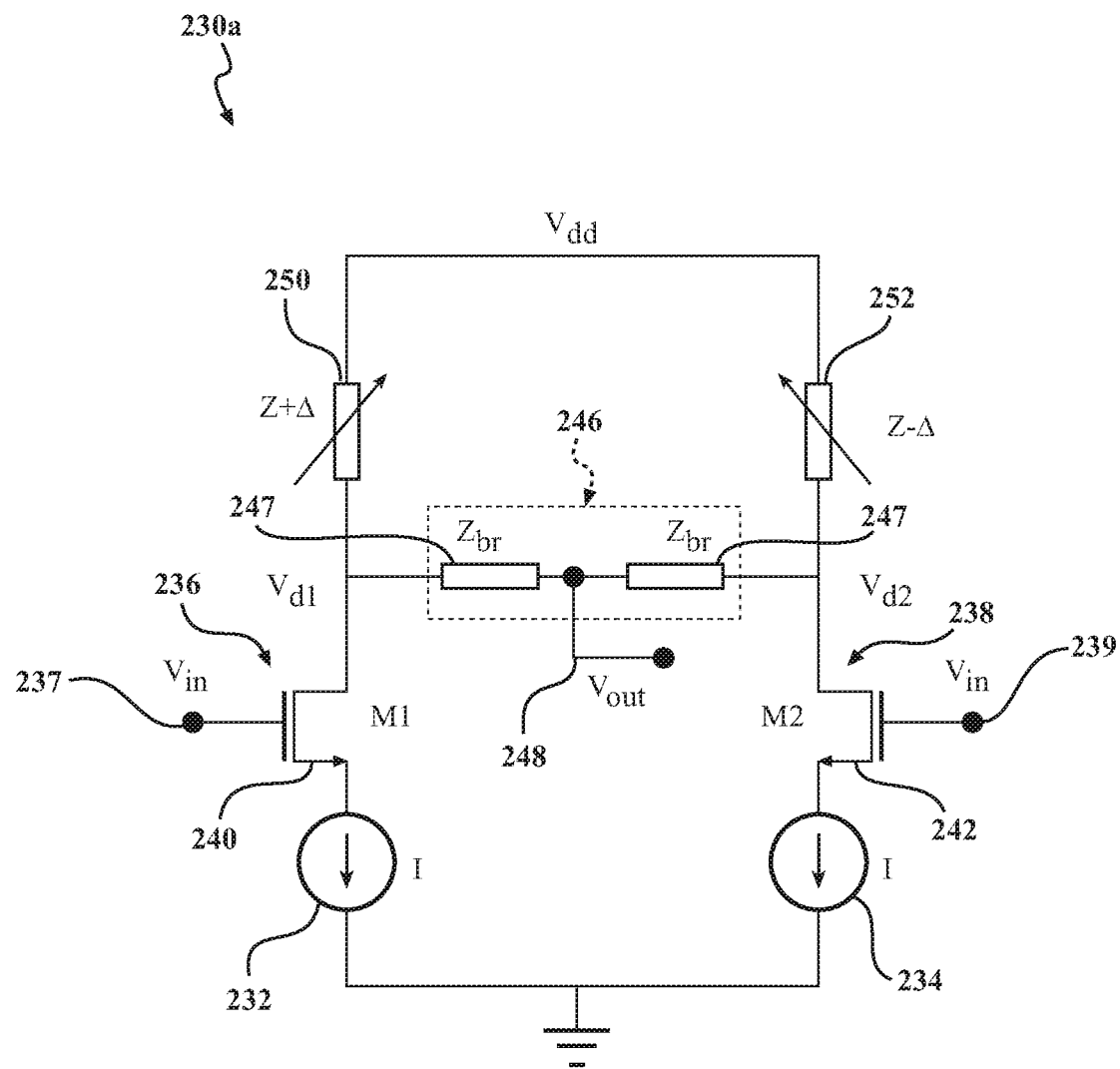
FIG. 13 schematically illustrates a current steering bridge circuit having a differential amplifier with current sink to form the bridge circuit, according to one or more embodiments shown and described herein.

FIG. 13 schematically illustrates a current steering bridge circuit 230a having a differential amplifier with current sink to form the bridge circuit. The tail current 232, 234 sinks with a pair of transistors 236, 238 having a corresponding drain load 240, 242. The bridging element between the drains 240, 242 of transistors 236, 238 allows for a differential current between the loads of the drains 240, 242. Because the drains 240, 242 load between the transistors 236, 238, the drain load is balanced, there is not any current passing through the bridge element. However, if there was an impedance creating an unbalanced condition on the drain loads, and if the transistors 236, 238 were on, there would be a current flowing through the bridge, which can be sensed.

As such, by having one drain load remain the same and replacing the other drain load with a sensing element that has a matching impedance to the drain load remaining, such as, without limitation, a capacitive, inductive, or an electrical sensing elements configured to detect the change in electrical resistance of a semiconductor or a metal under mechanical strain, the steering bridge 230 becomes a sensing circuit.

The steering bridge 230a includes a voltage divider 246 having a pair of bridging impedance elements $Z_{br}$ 247 with an output $V_{out}$ 248 between the impedance elements $Z_{br}$ 247. Moreover, the steering bridge 230 includes impedances $z_{+\Delta}$ 250 and $z_{-\Delta}$ 252. The impedances 250, 252 may be replaced with the bridging impedance elements 247 to become the bridging impedance elements within the voltage divider 246.

Figure 14A:
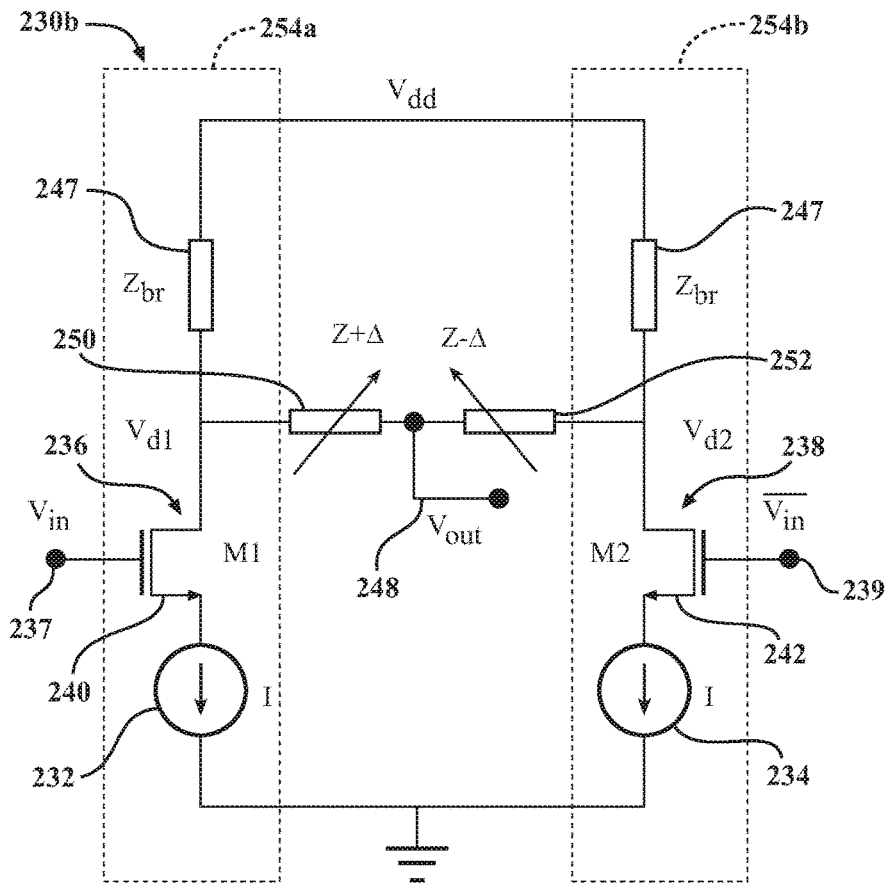
FIG. 14A schematically illustrates the steering bridge circuit of a FIG. 13 with the impedances replaced with the bridging impedance elements, according to one or more embodiments shown and described herein.

FIG. 14A schematically illustrates the steering bridge circuit 230a of FIG. 13 with the impedances 250, 252 replaced with the bridging impedance elements 247. The voltage inputs 237, 239 on the transistors 236, 238 are complementary with the current source 232, 234 and the loading impedance elements $Z_{br}$ 247. Therefore, the steering bridge circuit 230b has a similar Thevenin equivalent as discussed in FIG. 12 above. However, in the current steering bridge circuit 230b, the voltage output 248 is significantly weaker as a result of the voltage divider 246 (FIG. 13) and bridging impedance elements 247 having a strong impedance (1/gm). Therefore, in sensor applications, the output voltage 248 is a differential and proportional to the difference Δ.

Figure 14B:
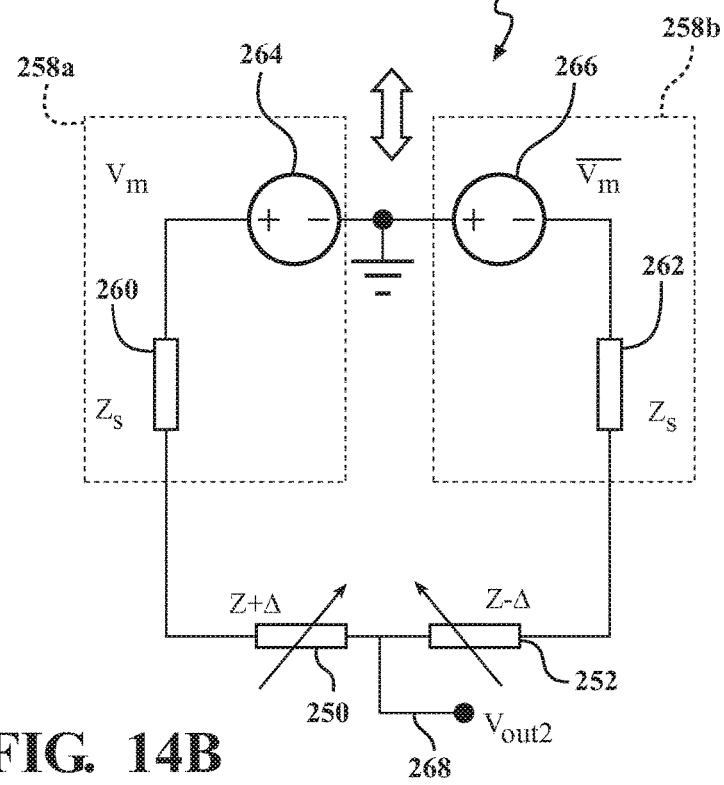
FIG. 14B schematically illustrates a Thevenin equivalent current steering bridge circuit of FIG. 14A, according to one or more embodiments shown and described herein.

FIG. 14B schematically illustrates a Thevenin equivalent current steering bridge circuit of FIG. 14A. Under the Thevenin equivalent circuit 230c, the transistor 236 (FIG. 14A), current 232 (FIG. 14A), and impedance 247 (FIG. 14A) of circuit components 254a (FIG. 14A) may be combined as an equivalent circuit 258a having a voltage source $V_m$ 264 and a source impedance $Z_s$ 260. Similarly, the transistor 238 (FIG. 14A), current 234 (FIG. 14A), and impedance 247 (FIG. 14A) of circuit components 254b (FIG. 14A) may be combined as an equivalent circuit 258b having a voltage source $V'_m$ 266 and a source impedance $Z_s$ 262. As such, the voltage sources 264, 266 are strong enough so that the source impedances 260, 262 become less than the bridging impedances 250, 252 so that the output voltage 248 may be determined by the equation:

$$V_{out} = \frac{\Delta}{z_s} V_m$$

where source $V_m$ 264 and source $V'_m$ 266 are a differential amplitude pair of voltage sources.

Figure 15A:
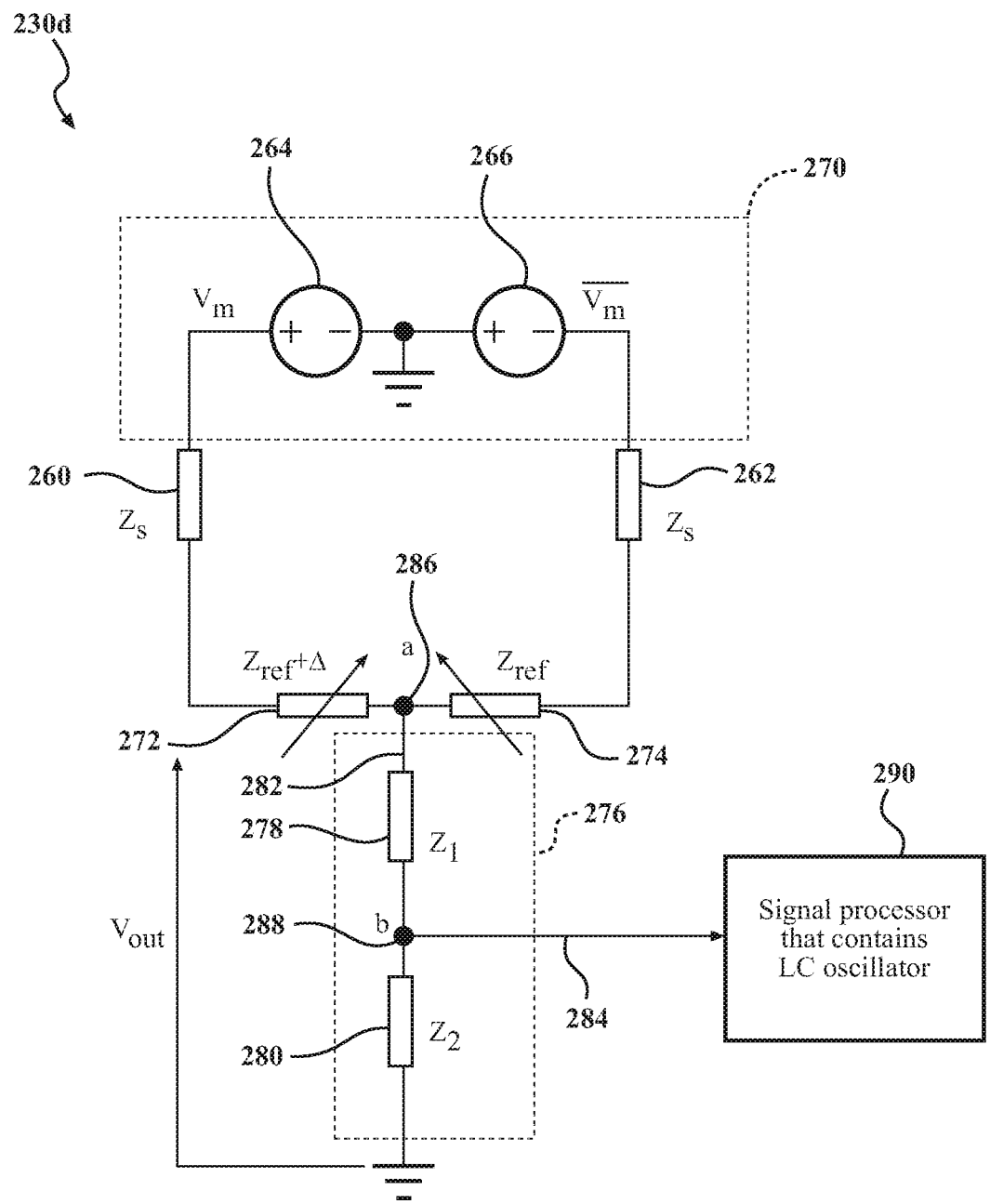
FIG. 15A schematically illustrates a differential impedance current steering bridge circuit having a quarter bridge of FIG. 14A, according to one or more embodiments shown and described herein.

FIG. 15A schematically illustrates a differential impedance current steering bridge circuit of FIG. 14A. The current steering bridge circuit 230d having a quarter bridge includes a differential voltage source 270, which includes voltage source $V_m$ 264 and voltage source $V'_m$ 266. The differential AC voltage source 270 has a 4 Mhz frequency and a $V_m$ amplitude. It should be appreciated that the frequency of the differential voltage source may be greater than or less than 4 Mhz. The sign convention on the voltage sources 264, 266 indicate the phase of the AC voltages. The source impedances $Z_s$ 260, 262 are connected to the voltage source $V_m$ 264 and voltage source $V'_m$ 266. The differential voltage source 270 drives the bridge, which includes an impedance pair at $Z_{ref}+\Delta$ 272 and $Z_{ref}$ 274. The impedance pair 272, 274 are a pair of capacitors but is not limited to capacitors and, as discussed below, may be inductors, resistors and/or other elements. A voltage divider 276 connects to the bridge at node 'a' 286 and includes an impedance pair $Z_1$ 278 and $Z_2$ 280. It should be appreciated that the impedance pair 278, 280 may be a pair of capacitors, inductors, resistors, any combination thereof, and/or other elements.

The differential impedance detects the difference of the impedance pair $\Delta=(Z_{ref+\Delta}-Z_{ref})$. The output 282 at the bridge node 'a' 286 becomes $$v_{out} = \frac{\Delta}{2Z_{ref}+\Delta} V_m$$

when Δ and source impedances $Z_s$ 260, 262 are small. Additionally, the output voltage 282 of the bridge at node 'a' 286 is too high of a frequency and is typically a delayed signal (lagged in phase) that must be attenuated and the phase needs to be adjusted. As a result, the voltage divider 276 of the current steering bridge 230c acts as a passive network to attenuate and adjust the phase. It should be appreciated that the current steering bridge circuit 230d may be applicable to a variety of sensing elements including capacitive, inductive, or resistive for decoding differential signal. The output 284 of the voltage divider 280 at node 'b' 288 is directed into a signal processor 290 that is configured for an LC oscillator. As such, the current steering bridge circuit 230*d* is a single AC bridge providing for the differential signal output 284.

Figure 15B:
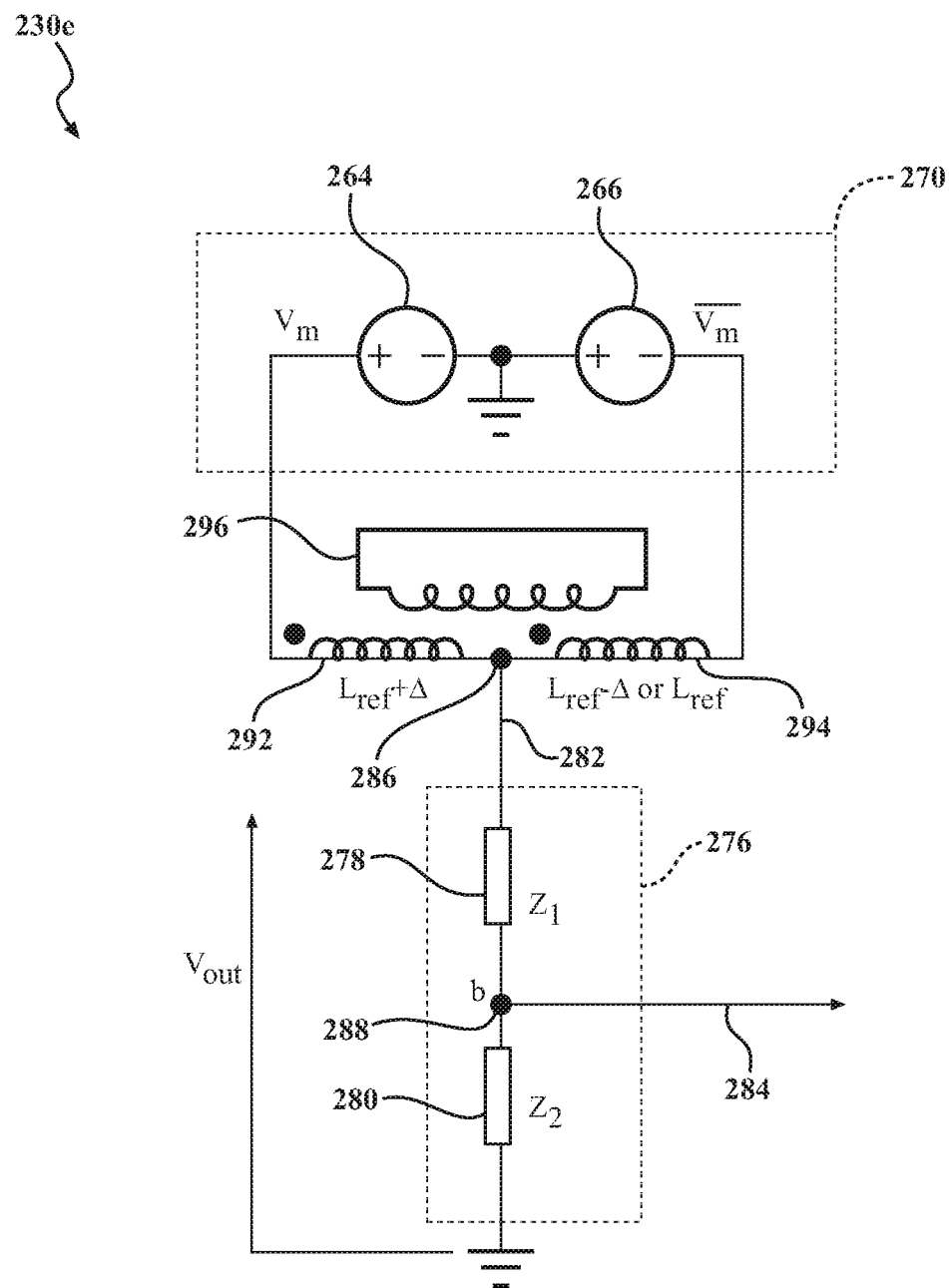
FIG. 15B schematically illustrates a differential impedance current steering bridge circuit having a quarter bridge of FIG. 14A, according to one or more embodiments shown and described herein.

FIG. 15B schematically illustrates a differential impedance current steering bridge circuit of FIG. 14A. The current steering bridge circuit 230*e* includes the differential AC voltage source 270 having the 4 Mhz frequency and the $V_m$ amplitude. It should be appreciated that the frequency of the differential voltage source may be greater than or less than 4 Mhz. The differential voltage source 270 includes voltage source $V_m$ 264 and voltage source $V'_m$ 266. The sign convention on the voltage sources 264, 266 indicate the phase of the AC voltages.

The differential voltage source 270 drives the bridge, which includes a sensing coil pair at $L_{ref}+\Delta$ 292 and $L_{ref}$ 294. The coil pair 272, 274 are a pair of inductors but is not limited to inductors and, as previously discussed, there may be capacitors, resistors and/or other elements. A coupler 296 is positioned with respect to the sensing coil pair 272, 274 so that the coupler 296 may move along the sensing coil pair 272, 274 so that the position of the coupler is detected by a differential signal generated by the current steering bridge output 282 at the bridge node 'a' 286 where $$v_{out} = \frac{\Delta}{2L_{ref}} V_m.$$

The voltage divider 276 connects to the bridge at node 'a' 286 and includes the impedance pair $Z_1$ 278 and $Z_2$ 280. It should be appreciated that the impedance pair 278, 280 may be a pair of capacitors, inductors, resistors, any combination thereof, and/or other elements. The voltage divider 276 provides the proper attenuated and phase as required by the signal processor 290 (FIG. 15A). As such, the current steering bridge circuit 230*e* is a single AC bridge providing for the differential signal output 284.

Figure 16:
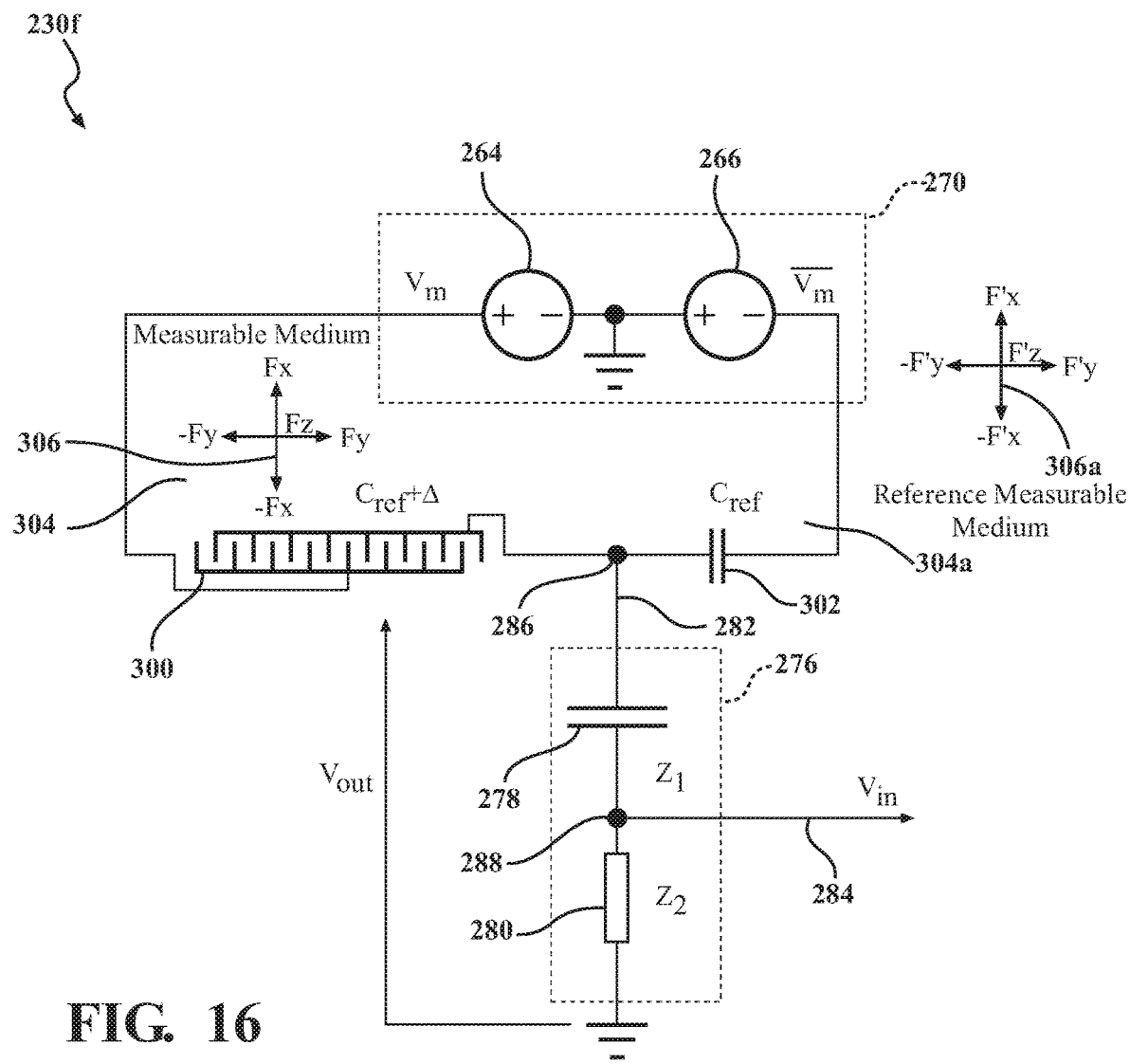
FIG. 16 schematically illustrates a differential capacitive current steering bridge circuit having a quarter bridge of FIG. 14A, according to one or more embodiments shown and described herein.

FIG. 16 schematically illustrates a differential capacitive current steering bridge circuit 230*f* of FIGS. 14A-14B, 15A-15B. The current steering bridge circuit 230*f* is illustrated with the differential AC voltage source 270 having voltage source $V_m$ 264 and voltage source $V'_m$ 266. The sign convention on the voltage sources 264, 266 indicate the phase of the AC voltages. The differential voltage source 270 drives the bridge, which is illustrated with a capacitance pair $C_{ref}+\Delta$ 300 and $C_{ref}$ 302. It should be appreciated that while the differential capacitive current steering bridge circuit 230*f* is illustrated with a capacitance pair. This is non-limiting and may be replaced with an impedance pair, a resistor pair, and/or a combination of capacitors, inductors and resistors. The voltage divider 276 connects to the bridge at node 'a' 286 and includes an impedance pair illustrated as a capacitor $Z_1$ 278 and a second impedance $Z_2$ 280. It should be appreciated that the impedance pair 278, 280 may be a pair of capacitors, inductors, resistors, any combination thereof, and/or other elements.

The capacitor $C_{ref}+\Delta$ 300 may be printed on the PCB 54 (FIG. 5B) and may be in contact with a measureable medium 304, such as a gas, a pressure, a fluid, and the like, that may be changed or varied based on a force, a level, and the like. In some embodiments, a force may be applied either to a fluid, a gas, a pressure and the like which is measureable by the capacitor $C_{ref}+\Delta$ 300. In other embodiments, the force may be directly applied to a pair of plates, sidewalls, and the like which may be detected by or the space between may be sensed by the capacitor $C_{ref}+\Delta$ 300 such that the force may be determined, as discussed in greater detail herein. Further, it is appreciated that the force applied to the fluid, the gas, forming the pressure, changing the space, and the like may be in a plurality of angles (0 degrees to 360 degrees) referenced from the capacitor $C_{ref}+\Delta$ 300, and as illustrated by the direction arrows 306. As the measureable medium 304 changes in any direction, as indicated by the direction arrows 306, the measureable medium 304 changes such that the change in the measureable medium 304 is detected by the at least the capacitor $C_{ref}+\Delta$ 300, and is output by the differential signal output 282 due to the capacitance change $\Delta$ varying with the change in the measureable medium 304 in contact with the capacitor 300. The voltage divider 276 provides the proper attenuated and phase as required by the signal processor 290 (FIG. 15A). As such, the current steering bridge circuit 230*f* is a single AC bridge providing for the differential signal output 284.

It should be appreciated that that the capacitor $C_{ref}+\Delta$ 300 may be replaced by a discrete component and the steering bridge circuit 230*f* may behave in the same manner by using the amount or level of the measurable medium 304 moving along the sensing electrode pair so that the amount or level of the measurable medium 304 detected by the differential signal output 282 due to the change $\Delta$ varying with the amount or level of the measurable medium 304.

It should be appreciated that because the differential AC voltage source 270 (FIG. 14A-16) is operating at a 4 Mhz frequency the advantage over conventional capacitive sensors designs is that the present embodiments operate at nearly 400 times a higher frequency than conventional capacitive sensors. As such, the source impedance becomes 400 times lower than conventional capacitive sensors such that the present embodiment capacitive sensor has considerably better noise performance.

It should be appreciated that the above embodiments are not limited to the differential voltage sources as described above. In a non-limiting example, an LC oscillator circuit with a center tap may be transformed to a differential voltage source having a transformed series resistance R and phasor $V_m$. The equivalent source impedance $R_s$ becomes Q times R of the original circuit, and the $V_m$ can be evaluated from Q and tank impedance.

Furthermore, if the inductor does not have a center tap for powering, but has a pair of identical resistor for powering the circuit, the circuit function will be nearly identical as of the circuit with center tapped inductor, however there will be a lower voltage swing due to the loss of Q, quality factor for the powering resistor pair. This differential voltage source structure is advantageous because it provides a calibration for proper balancing of the differential voltage pair of $V_m$ and $V'_m$ using the trimming of the pair of powering resistors, which is inherently easier than using an inductor. Moreover, this differential voltage source structure is advantageous because in certain applications, the average voltage of $V_{out}$ can be lowered to eliminate the bias voltage of downstream of the circuit, such that when the sensing element is a conductive element.

Figure 17A:
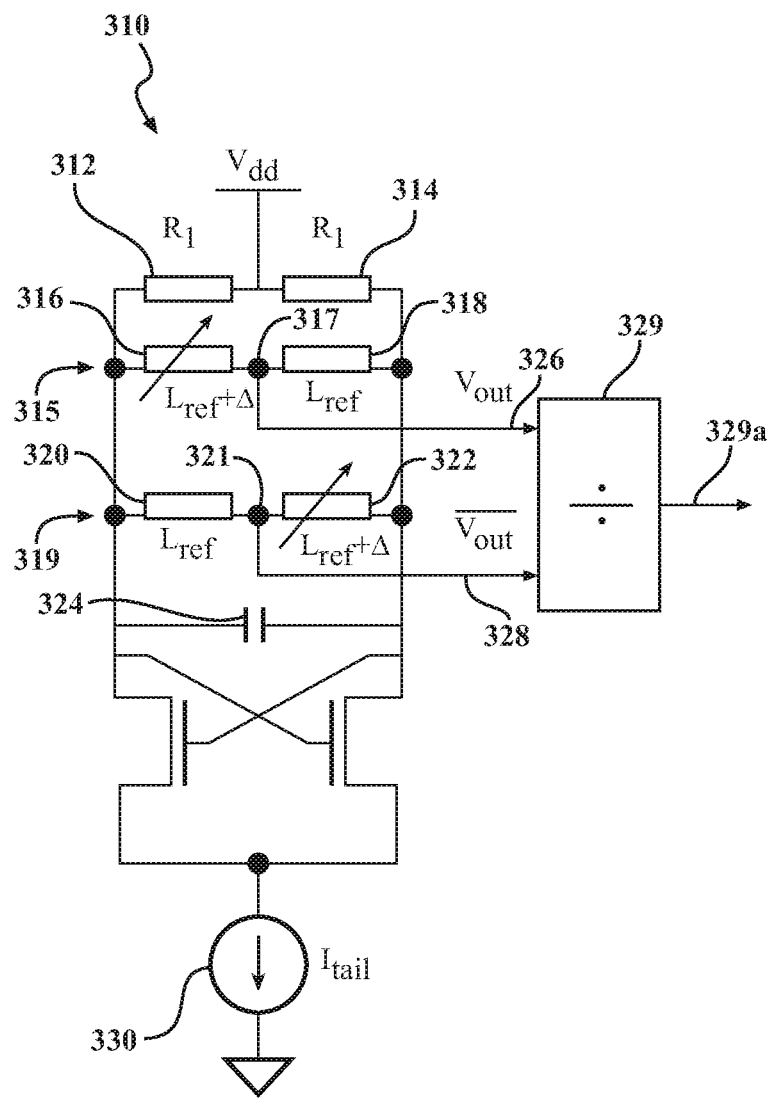
FIG. 17A schematically illustrates a differential inductive current steering bridge circuit without a center tap having two variable inductors, according to one or more embodiments shown and described herein.

FIG. 17A schematically illustrates a dual bridge differential inductive current steering bridge circuit without a center tap having two variable inductors. Current steering bridge circuit 310 includes a pair of resistors 312, 314, a capacitor 324, a tail current 330, and two bridges 315, 319. While illustrated as the pair of resistors 312, 314 and the capacitor 324, this is non-limiting and the pair of resistors 312, 314 may be a pair of inductors, a pair of capacitors, and/or a combination thereof. The capacitor 324 may be a resistor and/or an inductor. The first bridge 315 having a node 317 separates a first pair of sensing elements including a first sensing element 316 from a second sensing element 318 with the first sensing element 316 having the delta change. That is, the first sensing element 316 is configured to detect a change in the amount in the measurable medium 304 such as a change in fluid, pressure, gas or the like, that may be caused by the level change, by the force in the force direction 306 (FIG. 16), and the like. The second sensing element 318 is configured to detect a reference value 306a of the measurable medium 304a (FIG. 16), as discussed in greater detail herein. The first and second sensing elements 316, 318 may be a pair of inductors, a pair of capacitors, a pair of resistors, and/or a combination thereof. It should be appreciated that the first sensing element 316 configured to detect a change in the amount in the measurable medium 304 (FIG. 16) is non-limiting and the second sensing element 318 may be configured to detect a change in the amount in the measurable medium 304 (FIG. 16) and the first sensing element 316 may be configured to detect the reference value 306a (FIG. 16) of the measurable medium 304a (FIG. 16). The first bridge 315 outputs from the first node 317 a first differential signal 326. The first differential signal 326 may contain information relating to a difference between the sensed measurable medium 304 (FIG. 16), by the first sensing element 316, and the reference measurable medium 304a, sensed by the second sensing element 318.

The second bridge 319 having a second node 321 separates a second pair of sensing elements including a third sensing element 320 from a fourth sensing element 322 with the fourth sensing element 322 having the delta change. That is, the fourth sensing element 322 is configured to detect a change in the amount in the measurable medium 304 (FIG. 16) such as a change in fluid, pressure, gas or the like, that may be caused by the level change, by the force in the force direction 306 (FIG. 16), and the like, as discussed in greater detail herein. The third sensing element 320 is configured to detect a reference value 306a of the measurable medium 304a (FIG. 16), as discussed in greater detail herein. The third and fourth sensing elements 320, 322 may be a pair of inductors, a pair of capacitors, a pair of resistors, and/or a combination thereof. It should be appreciated that the fourth sensing element 322 configured to detect a change in the amount in the measurable medium 306 (FIG. 16) is non-limiting and the third sensing element 320 may be configured to detect a change in the amount in the measurable medium 304 (FIG. 16) and the fourth sensing element 322 may be configured to detect the reference value 306a (FIG. 16) of the measurable medium 304 (FIG. 16). The second bridge 319 outputs from the second node 321 a second differential signal 328. The second differential signal 328 may contain information relating to a difference sensed between the measurable medium 304 (FIG. 16), by the fourth sensing element 322, and the reference measurable medium 304a (FIG. 16), sensed by the third sensing element 320.

Further, in some embodiments, the first differential signal 326 and the second differential signal 328 are input into a divider 329 such that the signals are divided or are transformed into a ratio indicated by a ratio-metric output 329a. It is appreciated that the bridge circuit 310 may be an LC circuit without a center tap and includes more than one set of sensing coils. The sensing coils may be separated because the inductance of a resonator has a dual function. First, as a resonator coil, and second, as a sensing coil when modulated with an eddy plate. That is, the first differential output 326 may be output from the first bridge 315 between the pair of sensing elements 316, 318 and the second differential signal 328 may be generated from the second bridge 319 between two separate and distinct sensing elements 320, 322. As such, it is possible that to use one LC oscillator circuit 310 in one location, such as within a reservoir, a tank, between a pair of sidewalls or plates that are compressible, and the like, or in more than one or separate reservoirs, tanks, between a second pair of sidewalls or plates that are compressible, and the like.

Figure 17B:
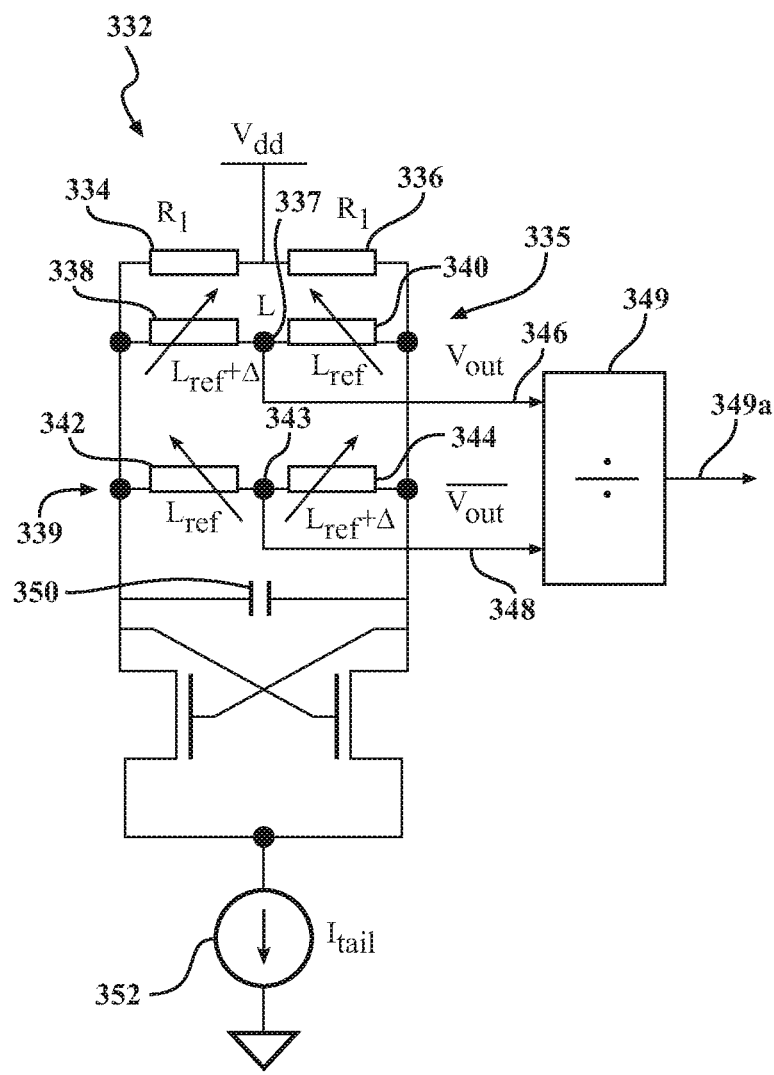
FIG. 17B schematically illustrates a differential inductive current steering bridge circuit without a center tap having four variable inductors, according to one or more embodiments shown and described herein.

FIG. 17B schematically illustrates a differential bridge circuit 332 without a center tap having four variable inductors. The bridge circuit 332 includes a pair of resistors 334, 336, a capacitor 350, a tail current 352, and two bridges 335, 339. While illustrated as the pair of resistors 312, 314 and the capacitor 350, this is non-limiting and the pair of resistors 312, 314 may be a pair of inductors, a pair of capacitors, and/or a combination thereof. The capacitor 350 may be a resistor and/or an inductor. The first bridge 335 has a node 337 separating a first pair of sensing elements including a first sensing element 338 from a second sensing element 340 with both the first sensing element 338 and the second sensing element 340 being variable and the first sensing element 338 having the delta change. The first and second sensing elements 338, 340 may be a pair of inductors, a pair of capacitors, a pair of resistors, and/or a combination thereof.

That is, the first sensing element 338 is configured to detect a change in the amount in the measurable medium 304 (FIG. 16) such as a change in fluid, pressure, force, gas or the like, that may be caused by the level change, by the force in the force direction 306 (FIG. 16), and the like. The second sensing element 340 is configured to detect a reference value 306a (FIG. 16) of the measurable medium 304a (FIG. 16), as discussed in greater detail herein. It should be appreciated that the first sensing element 338 configured to detect a change in the amount in the measurable medium 304 (FIG. 16) is non-limiting and the second sensing element 340 may be configured to detect a change in the amount in the measurable medium 304 (FIG. 16) and the first sensing element 338 may be configured to detect the reference value 306a (FIG. 16) of the measurable medium 304a (FIG. 16). The first bridge 335 outputs from the first node 337 a first differential signal 346. The first differential signal 346 may contain information relating to a difference sensed between the measurable medium 304 (FIG. 16), by the first sensing element 338, and the reference measurable medium 304a (FIG. 16), sensed by the second sensing element 340.

The second bridge 339 has a second node 343 that separates a second pair of sensing elements including a third sensing element 342 from a fourth sensing element 344 with both the third sensing element 342 and the fourth sensing element 344 being variable and with the fourth sensing element 344 having the delta change. The third and fourth sensing elements 342, 344 may be a pair of inductors, a pair of capacitors, a pair of resistors, and/or a combination thereof. That is, the fourth sensing element 344 is configured to detect a change in the amount in the measurable medium 304 (FIG. 16) such as a change in fluid, pressure, force, gas or the like, that may be caused by the level change, by the force in the force direction 306 (FIG. 16), and the like, as discussed in greater detail herein. The third sensing element 342 is configured to detect a reference value 306a (FIG. 16) of the measurable medium 304a (FIG. 16), as discussed in greater detail herein. It should be appreciated that the fourth sensing element 344 configured to detect a change in the amount in the measurable medium 306 (FIG. 16) is non-limiting and the third sensing element 342 may be configured to detect a change in the amount in the measurable medium 304 (FIG. 16) and the fourth sensing element 344 may be configured to detect the reference value 306a (FIG. 16) of the measurable medium 304 (FIG. 16). The second bridge 339 outputs from the second node 343 a second differential signal 348. The second differential signal 348 may contain information relating to a difference sensed between the measurable medium 304 (FIG. 16), by the fourth sensing element 344, and the reference measurable medium 304a (FIG. 16), sensed by the third sensing element 342.

Further, in some embodiments, the first differential signal 346 and the second differential signal 348 are input into a divider 349 such that the signals are divided or are transformed into a ratio indicated by a ratio-metric output 349a. It is appreciated that the bridge circuit 332 may have dual LC oscillators configured to generate two outputs from more than one or separate reservoirs, tanks, between a second pair of sidewalls or plates that are compressible, and the like and may be independent of one another.

As discussed above, while the LC circuit differential voltage source structure without a center tap may be used in quarter bridges, this structure may also be used on half and full bridge structures.

Figure 17C:
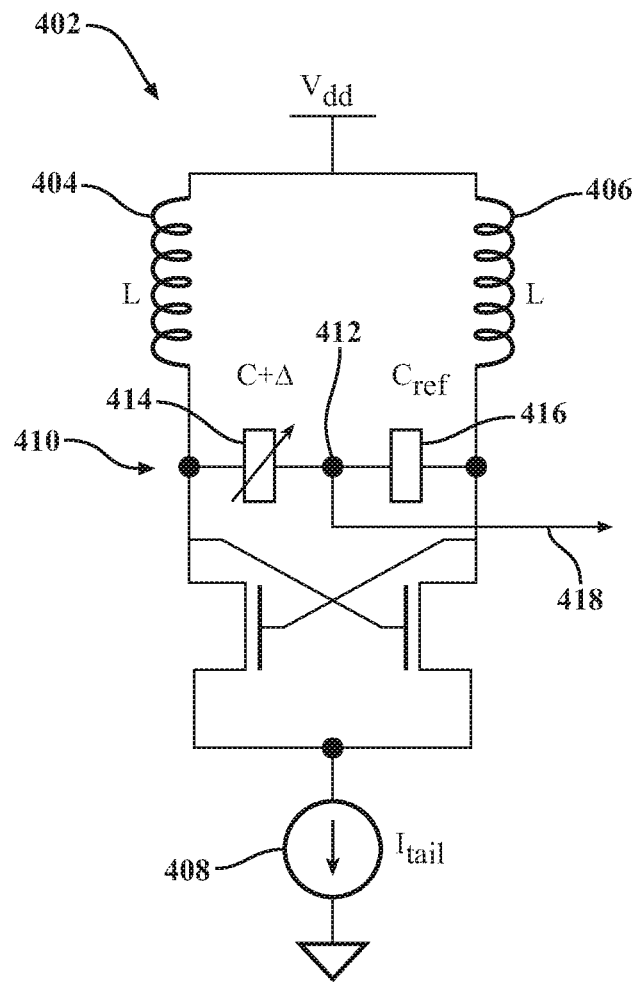
FIG. 17C schematically illustrates a single bridge differential circuit, according to one or more embodiments shown and described herein.

FIG. 17C schematically illustrates a single bridge differential circuit 402. The bridge circuit 402 includes a pair of inductors 404, 406, a tail current 408, and a bridge 410. While illustrated as the pair of inductors 404, 406, this is non-limiting and the pair of inductors may be a pair of resistors, a pair of capacitors, and/or a combination thereof. The bridge 410 has a node 412 that separates a first pair of sensing elements including a first sensing element 414 from a second sensing element 416 with the first sensing element 414 having the delta change. The first and second sensing elements 414, 416 may be a pair of inductors, a pair of capacitors, a pair of resistors, and/or a combination thereof. That is, the first sensing element 414 is configured to detect a change in the amount in the measurable medium 304 (FIG. 16) such as a change in fluid, pressure, gas or the like, that may be caused by the level change, by the force in the force direction 306 (FIG. 16), and the like. The second sensing element 416 is configured to detect a reference value 306a (FIG. 16) of the measurable medium 304a (FIG. 16), as discussed in greater detail herein. It should be appreciated that the first sensing element 414 configured to detect a change in the amount in the measurable medium 304 (FIG. 16) is non-limiting and the second sensing element 416 may be configured to detect a change in the amount in the measurable medium 304 (FIG. 16) and the first sensing element 414 may be configured to detect the reference value 306a (FIG. 16) of the measurable medium 304a (FIG. 16). The bridge 410 outputs from the node 412 a differential signal 418. The differential signal 418 may contain information relating to a difference sensed between the measurable medium 304 (FIG. 16), by the first sensing element 414, and the reference measurable medium 304a (FIG. 16), sensed by the second sensing element 416.

Figure 17D:
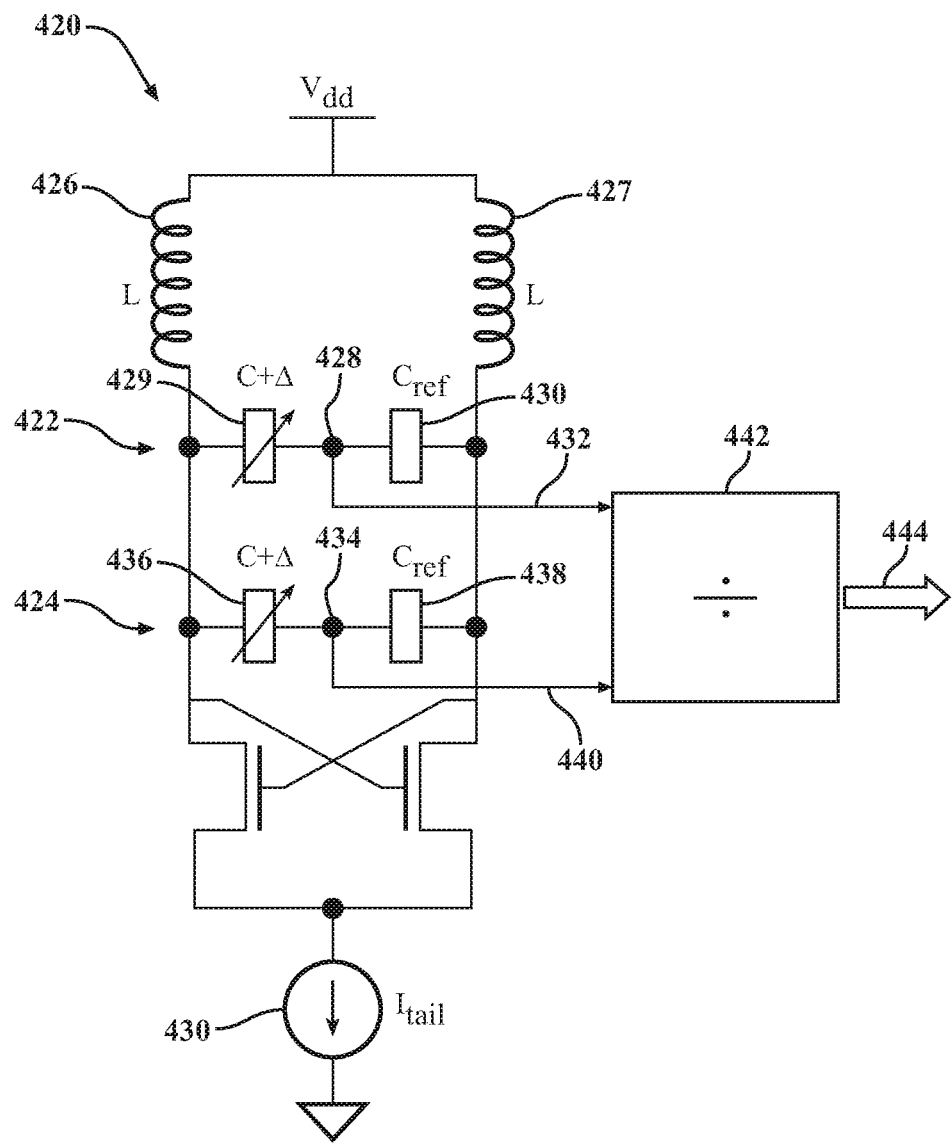
FIG. 17D schematically illustrates a differential bridge circuit with dual bridges, according to one or more embodiments shown and described herein.

FIG. 17D schematically illustrates a differential bridge circuit 420 with dual bridges 422, 424. The bridge circuit 420 further includes a pair of inductors 426, 427 and a tail current 430. While illustrated as the pair of inductors 426, 427, this is non-limiting and the pair of inductors 426, 427 may be a pair of resistors, a pair of capacitors, and/or a combination thereof. The first bridge 422 has a node 428 separating a first pair of sensing elements including a first sensing element 429 from a second sensing element 430 with the first sensing element 429 being variable and the first sensing element 429 having the delta change.

That is, the first sensing element 429 is configured to detect a change in the amount in the measurable medium 304 such as a change in fluid, pressure, force, gas or the like, that may be caused by the level change, by the force in the force direction 306 (FIG. 16), and the like. The second sensing element 430 is configured to detect a reference value 306a (FIG. 16) of the measurable medium 304a (FIG. 16), as discussed in greater detail herein. It should be appreciated that the first sensing element 429 configured to detect a change in the amount in the measurable medium 304 (FIG. 16) is non-limiting and the second sensing element 430 may be configured to detect a change in the amount in the measurable medium 304 (FIG. 16) and the first sensing element 429 may be configured to detect the reference value 306a (FIG. 16) of the measurable medium 304a (FIG. 16). The first bridge 422 outputs from the first node 428 a first differential signal 432. The first differential signal 432 may contain information relating to a difference sensed between the measureable medium 304, by the first sensing element 429, and the reference measureable medium 304a (FIG. 16), sensed by the second sensing element 430.

The second bridge 424 has a second node 434 that separates a second pair of sensing elements including a third sensing element 436 from a fourth sensing element 438 with the third sensing element 436 being variable and with the third sensing element 436 having the delta change. That is, the third sensing element 436 is configured to detect a change in the amount in the measurable medium 304 such as a change in fluid, pressure, gas or the like, that may be caused by the level change, by the force in the force direction 306 (FIG. 16), and the like, as discussed in greater detail herein. The fourth sensing element 438 is configured to detect a reference value 306a of the measurable medium 304a, as discussed in greater detail herein. It should be appreciated that the third sensing element 436 configured to detect a change in the amount in the measurable medium 306 is non-limiting and the fourth sensing element 438 may be configured to detect a change in the amount in the measurable medium 304 and the third sensing element 436 may be configured to detect the reference value 306a of the measurable medium 304. The second bridge 424 outputs from the second node 434 a second differential signal 440. The second differential signal 440 may contain information relating to a sensed difference between the measurable medium 304 (FIG. 16), by the third sensing element 436, and the reference measurable medium 304a (FIG. 16), sensed by the fourth sensing element 438.

Further, in some embodiments, the first differential signal 432 and the second differential signal 440 are input into a divider 442 such that the signals are divided or are transformed into a ratio indicated by a ratio-metric output 444.

Figure 17E:
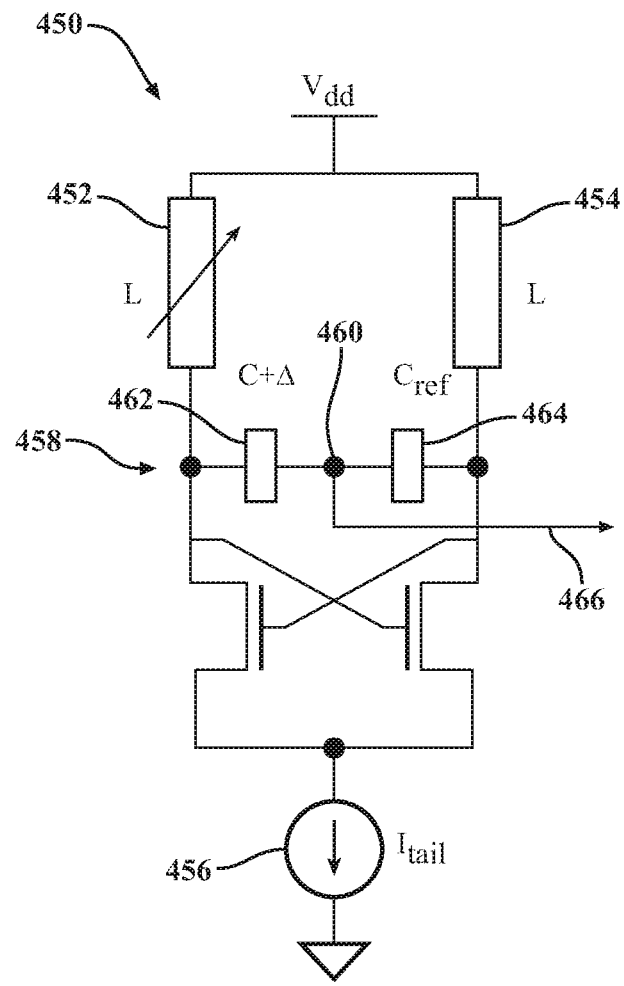
FIG. 17E schematically illustrates a single bridge ratio-metric circuit, according to one or more embodiments shown and described herein.

FIG. 17E schematically illustrates a single bridge ratio-metric circuit 450. The bridge circuit 450 includes a pair of sensing elements including a first sensing element 452 and a second sensing element 454 with the first sensing element 452 having the delta change. While the first and second sensing elements 452, 454 are illustrated as a pair of inductors, this is non-limiting and may be a pair of resistors, a pair of capacitors, and/or a combination thereof. That is, the first sensing element 452 is configured to detect a change in the amount in the measurable medium 304 such as a change in fluid, pressure, force, gas or the like, that may be caused by the level change, by the force in the force direction 306 (FIG. 16), and the like. The second sensing element 454 is configured to detect a reference value 306a (FIG. 16) of the measurable medium 304a (FIG. 16), as discussed in greater detail herein. It should be appreciated that the first sensing element 452 configured to detect a change in the amount in the measurable medium 304 (FIG. 16) is non-limiting and the second sensing element 454 may be configured to detect a change in the amount in the measurable medium 304 (FIG. 16) and the first sensing element 452 may be configured to detect the reference value 306a (FIG. 16) of the measurable medium 304a (FIG. 16).

The bridge circuit 450 further includes a tail current 456 and a bridge 458. The bridge 458 has a node 460 that separates a first element 462 from a second element 464. The first and second elements 462, 464 may be a pair of inductors, a pair of resistors, a pair of capacitors, and/or a combination thereof. The bridge 458 outputs from the node 460 a ratio-metric signal 466. The ratio-metric signal 466 may contain information relating to a ratio, or division difference, sensed between the measurable medium 304 (FIG. 16), by the first sensing element 452, and the reference measurable medium 304a (FIG. 16), sensed by the second sensing element 454.

Referring back to FIGS. 17C-17D and FIGS. 4-5, it is appreciated that the differential bridge circuit 420 may have dual AC bridges for a ratio-metric output. The two differential outputs are independent from, or eliminate, common mode noise typically found in transducers and in the circuit through the AC bridge. Further, the ratio-metric output 444 is a ratio of each differential output signal 432, 440. Further, the ratio-metric can be applicable to inductive, capacitive, or resistive measurements. It should be appreciated that the circuits described herein simultaneously remove common mode noise while devising two differential signals.

Figure 18:
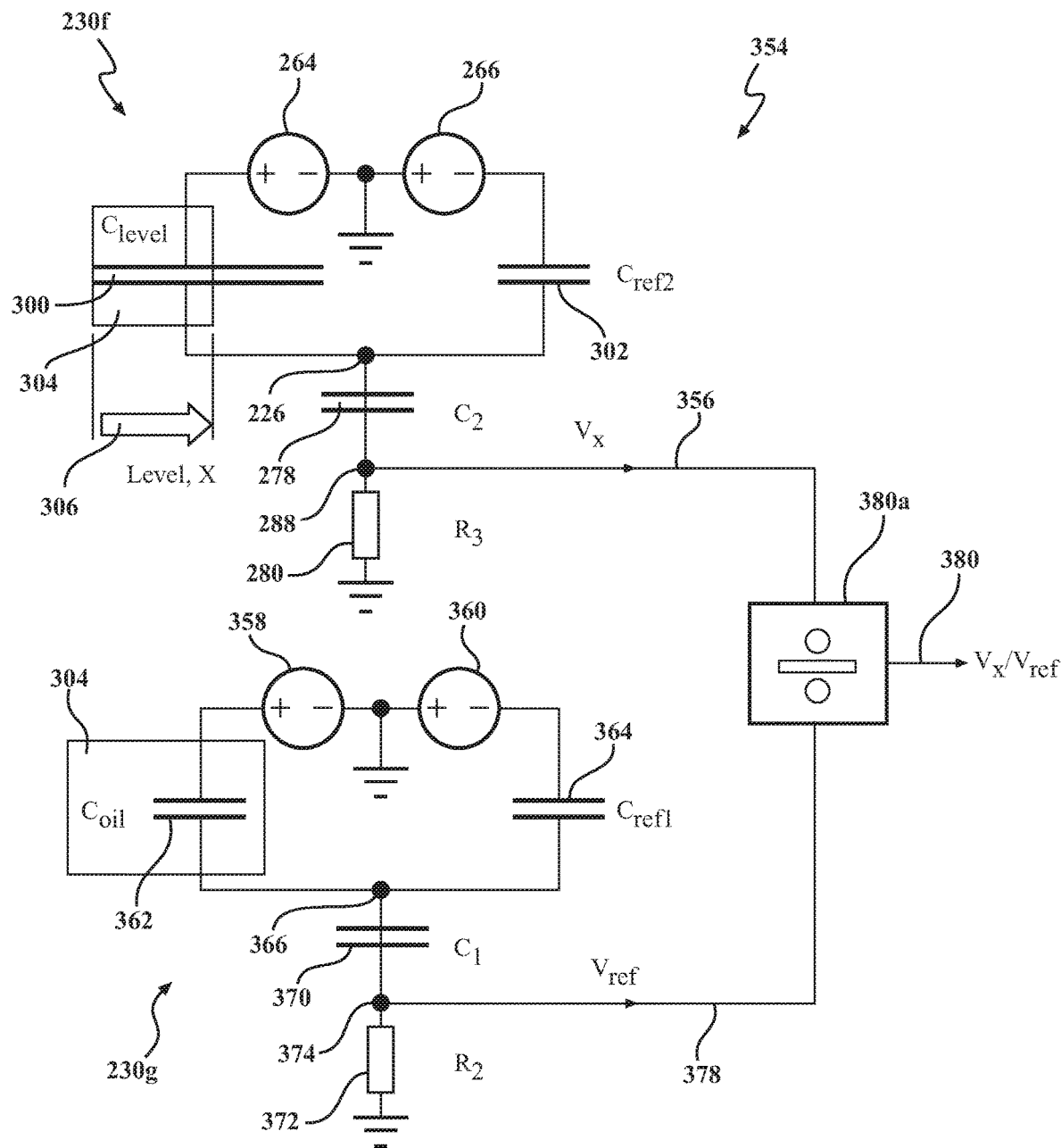
FIG. 18 schematically illustrates a ratio-metric output of differential capacitive current steering bridge circuit, according to one or more embodiments shown and described herein.

Now referring to FIG. 18, which schematically illustrates a ratio-metric output of differential capacitive current steering bridge circuit 354, which includes circuit 230g and the differential capacitive current steering bridge circuit 230f (FIG. 16). The current steering bridge circuit 230g includes a differential AC voltage source having voltage source $V_m$ 358 and voltage source $V'_m$ 360. The sign convention on the voltage sources 358, 360 indicate the phase of the AC voltages. The differential voltage source drives the bridge, which includes a capacitance pair $C_{oil}$ 362 and $C_{refl}$ 364. The voltage divider connects to the bridge at node 366 and includes an impedance pair illustrated as a capacitor $C_1$ 370 and a second impedance $Z_2$ 372. It should be appreciated that the impedance pair 370, 372 may be a pair of capacitors, inductors, resistors, any combination thereof, and/or other elements. The capacitor $C_{oil}$ 362 may be printed on a PCB board and configured to detect a change in the amount in the measurable medium 304 (FIG. 16) such as a change in fluid, pressure, gas or the like, that may be caused by the level change, by the force in the force direction 306 (FIG. 16), and the like. In some embodiments, the capacitor $C_{oil}$ 362 and PCB may be submerged in a fluid, surround by a gas, positioned where there is a pressure, positioned between compressive mediums, and the like such that a change in force may be detected. The output, which may be indicative of a change in force, fluid, gas, pressure and the like, is a first differential output 378 taken from the voltage divider node 374. The same may occur in a reference capacitor 364, such that the outputs may be compared or used to define a ratio. It should be appreciated that the reference may be used to determine a dielectric fluid, a creep of a material, and the like In this embodiment, a ratio-metric output 380 may be generated by a divider 380a by taking the ratio of the output $V_x$ 356 of the differential capacitive current steering bridge circuit 230f and dividing by the output 378 of the differential capacitive current steering bridge circuit 230g. The output $V_x$ 356 measures the measureable medium 304 while the output $V_{ref}$ 378 generates the reference capacitance value from the reference measureable medium 304a. The electrodes of the $C_{oil}$ capacitor 362 may be subjected to a force, a pressure, a fluid and the like depending on the application as appreciated by one skilled in the art. By determining a ratio between the output 356 and output 378, the force type (i.e., caused from gas, fluid, or some other medium), fluid type, temperature, common noise and electromagnetic interference are now disregarded.

Therefore, according to the present embodiments described above, noise reduction in inductive sensing is completed in one of two ways, through the RF frequency operation of the sensor board or through ratio-metric processing of the two output signals.

According to the above disclosure, the capacitive sensing mechanism of the present inventions utilize ratio metric and differential concepts in order to cancel most variation associated with unintended influences, the differential structure to sensing element further eliminating most common mode influences. Additional considerations include a ratio of the two signals generated being presented in order to further reduce common mode influence. The use of the LC type drive mechanism further allows for noise immunity as well as low emissions from the drive harmonic.

It should be appreciated that an inductive sensor with a LC oscillator can be used as part of the current steering bridge pair of a capacitive sensor, which finds its application for detecting fluid level, fluid quality, acceleration, humidity, pressure, or some gas intensity, when a proper impedance, capacitance variation is detectable with respect to the intensity of the gas or level of any fluid. Moreover, an LC inductive circuit has a good differential voltage source to drive the bridges or modified bridges as shown to measure the quantities in ratio-metric way to compensate temperature, electromagnetic interface, or mechanical variation of the sensor device.

Further, it should be appreciated that discrete components may replace any of the sensing elements described above including, without limitation, capacitors, inductors, or resistors.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:
1. A system comprising:
 a processor;
 a bridge circuit comprising:
  a pair of differential voltage sources configured to drive the bridge circuit,
  a first pair of sensing elements generating a pair of measurement signals, the pair of measurement signals are independent of one another and based on the respective sensing element, and
  a second pair of sensing elements communicatively coupled to the first pair of sensing elements, the second pair of sensing elements defining a first divider, the pair of measurement signals are input into the respective second sensing element of the second pair of sensing elements, the first divider is configured to output a first output signal to the processor, wherein the first output signal is a differential signal of the first pair of sensing elements indicative of a quantity of a measurable medium; and a transducer communicatively coupled to the bridge circuit, wherein the differential signal output by the first divider is independent from a common mode signal.

2. The system of claim 1, wherein the differential signal is a ratio of the pair of measurement signals.

3. The system of claim 1, wherein the system is integrated into an oscillator of the processor, the oscillator produces a radio frequency oscillation.

4. The system of claim 1, wherein the first pair of sensing elements that generate the pair of measurement signals are capacitors, the second pair of sensing elements are a combination from a group of capacitors, inductors, and resistors, the pair of measurement signals is a differential capacitance measurement that corresponds to a force in contact with the bridge circuit.

5. The system of claim 1, wherein the first pair of sensing elements that generate the pair of measurement signals are capacitors, the second pair of sensing elements are a combination from a group of capacitors, inductors, and resistors, the pair of measurement signals is a differential capacitance measurement that corresponds to a pressure or a fluid in contact with the bridge circuit.

6. The system of claim 1, wherein the first pair of sensing elements that generate the pair of measurement signals are resistors, the second pair of sensing elements are a combination from a group of capacitors, inductors, and resistors, the pair of measurement signals is a differential impedance measurement that corresponds to a force in contact with the bridge circuit.

7. The system of claim 1, wherein the first pair of sensing elements to generate the pair of measurement signals are resistors, the second pair of sensing elements are a combination from a group of capacitors, inductors, and resistors, the pair of measurement signals is a differential impedance measurement that corresponds to a pressure or a fluid in contact with the bridge circuit.

8. The system of claim 1, wherein the first pair of sensing elements to generate the pair of measurement signals are inductors, the second pair of sensing elements are a combination from a group of capacitors, inductors, and resistors, the pair of measurement signals is a differential inductance measurement that corresponds to a force in contact with the bridge circuit.

9. The system of claim 1, wherein the first pair of sensing elements to generate the pair of measurement signals are inductors, the second pair of sensing elements are a combination from a group of capacitors, inductors, and resistors, the pair of measurement signals is a differential inductance measurement that corresponds to a pressure or a fluid in contact with the bridge circuit.

10. The system of claim 1, wherein the bridge circuit is a center tapped inductive-capacitive oscillator that is configured to drive the first pair of sensing elements.

11. The system of claim 1, further comprising:
a third pair of sensing elements communicatively coupled to the first pair of sensing elements and in parallel with the second pair of sensing elements, the third pair of sensing elements defining a second divider, the pair of measurement signals are input into the respective third sensing elements of the third pair of sensing elements to output a second output signal to the processor, wherein the second output signal is a second differential signal of the first pair of sensing elements.

12. The system of claim 11, wherein the third pair of sensing elements are a combination from a group of capacitors, inductors, and resistors.

13. A system comprising:
a processor;
a bridge circuit comprising:
a pair of differential voltage sources configured to drive the bridge circuit,
a first pair of sensing elements; and
a second pair of sensing elements communicatively coupled to the first pair of sensing elements and generating a pair of measurement signals, the pair of measurement signals are independent of one another and based on the respective second sensing element, the second pair of sensing elements defining a first divider, the first divider is configured to output a first output signal to the processor,
wherein the first output signal is a differential signal of the first pair of sensing elements indicative of a quantity of a measurable medium; and a transducer communicatively coupled to the bridge circuit, wherein the differential signal output by the first divider is independent from a common mode signal.

14. The system of claim 13, wherein the first differential signal is a ratio of the pair of measurement signals.

15. The system of claim 13, wherein the first pair of sensing elements are a combination from a group of capacitors, inductors, and resistors, the second pair of sensing elements that generate the pair of measurement signals are capacitors, the pair of measurement signals is a differential capacitance measurement that corresponds to a force in contact with the bridge circuit.

16. The system of claim 13, wherein the first pair of sensing elements are a combination from a group of capacitors, inductors, and resistors, the second pair of sensing elements that generate the pair of measurement signals are resistors, the pair of measurement signals is a differential impedance measurement that corresponds to a force in contact with the bridge circuit.

17. The system of claim 13, wherein the first pair of sensing elements are a combination from a group of capacitors, inductors, and resistors, the second pair of sensing elements to generate the pair of measurement signals are inductors, the pair of measurement signals is a differential inductance measurement that corresponds to a force in contact with the bridge circuit.

18. A system comprising:
a bridge circuit comprising:
a pair of differential voltage sources configured to drive the bridge circuit,
a first pair of sensing elements;
a second pair of sensing elements communicatively coupled to the first pair of sensing elements and generating a first pair of measurement signals, the first pair of measurement signals are independent of one another and based on the respective second sensing element, the second pair of sensing elements define a first divider, the first divider is configured to output a first output signal,
a third pair of sensing elements communicatively coupled to the first pair of sensing elements and in parallel with the second pair of sensing elements, the third pair of sensing elements generating a second pair of measurement signals, the second pair of measurement signals are independent of one another and based on the respective third sensing element, the third pair of sensing elements defining a second divider, the second divider is configured to output a second output signal, wherein the first output signal and the second output signal are connected to a divider, the divider provides a ratio-metric output the ratio-metric output is independent from a common mode noise.

19. The system of claim 18, wherein:

the first pair of sensing elements are a combination from a group of capacitors, inductors, and resistors, the second pair of sensing elements that generate the first pair of measurement signals are capacitors, the third pair of sensing elements that generate the second pair of measurement signals are capacitors, and the first and second pair of measurement signals are a differential capacitance measurement that corresponds to a force in contact with the bridge circuit.

20. A system comprising:

a processor;

a bridge circuit comprising:

a pair of differential voltage sources configured to drive the bridge circuit, a first pair of sensing elements generating a pair of measurement signals, the pair of measurement signals are independent of one another and based on the respective sensing element, and a second pair of sensing elements communicatively coupled to the first pair of sensing elements, the second pair of sensing elements defining a first divider, the pair of measurement signals are input into the respective second sensing element of the second pair of sensing elements, the first divider is configured to output a first output signal to the processor, wherein the first output signal is a differential signal of the first pair of sensing elements a third pair of sensing elements communicatively coupled to the first pair of sensing elements and in parallel with the second pair of sensing elements, the third pair of sensing elements defining a second divider, the pair of measurement signals are input into the respective third sensing elements of the third pair of sensing elements to output a second output signal to the processor, wherein the second output signal is a second differential signal of the first pair of sensing elements.

* * * * *